US010910272B1

(12) United States Patent
Zhou et al.

(10) Patent No.: US 10,910,272 B1
(45) Date of Patent: Feb. 2, 2021

(54) REUSABLE SUPPORT SUBSTRATE FOR FORMATION AND TRANSFER OF SEMICONDUCTOR DEVICES AND METHODS OF USING THE SAME

(71) Applicant: SANDISK TECHNOLOGIES LLC, Addison, TX (US)

(72) Inventors: Fei Zhou, San Jose, CA (US); Senaka Kanakamedala, San Jose, CA (US); Raghuveer S Makala, Campbell, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/660,177

(22) Filed: Oct. 22, 2019

(51) Int. Cl.
*H01L 21/822* (2006.01)
*H01L 23/00* (2006.01)
(Continued)

(52) U.S. Cl.
CPC ...... *H01L 21/8221* (2013.01); *H01L 21/0272* (2013.01); *H01L 21/0331* (2013.01);
(Continued)

(58) Field of Classification Search
CPC ............ H01L 21/8221; H01L 21/7813; H01L 21/76254; H01L 21/76259; H01L 21/568;
(Continued)

(56) References Cited

U.S. PATENT DOCUMENTS 5,374,564 A    12/1994  Bruel
6,759,277 B1 *  7/2004  Flores ................. H01L 21/7806
                                                   257/E21.6
(Continued)

FOREIGN PATENT DOCUMENTS

KR    10-2010-003264 A    3/2010
KR    10-2014-005093 A    4/2014

OTHER PUBLICATIONS

U.S. Appl. No. 16/284,502, filed Feb. 25, 2019, SanDisk Technologies LLC.
(Continued)

*Primary Examiner* — Bac H Au
(74) *Attorney, Agent, or Firm* — The Marbury Law Group PLLC

(57) ABSTRACT

A support substrate including a plurality of channels on a front side is provided. A cover layer is formed by anisotropically depositing a sacrificial cover material over the plurality of channels. Cavities laterally extend within the plurality of channels underneath a horizontally extending portion of the cover layer. An encapsulation layer is conformally deposited. First semiconductor devices, first metal interconnect structures, and first bonding pads are formed over a top surface of the encapsulation layer. A device substrate with second bonding pads is provided. The second bonding pads are bonded with the first bonding pads to form a bonded assembly. Peripheral portions of the encapsulation layer are removes and peripheral portions of the cover layer are physically exposed. The cover layer is removed employing an isotropic etch process by propagating an isotropic etchant through the cavities to separate the support substrate from the bonded assembly.

19 Claims, 17 Drawing Sheets

(51) Int. Cl.
  *H01L 21/56* (2006.01)
  *H01L 27/11556* (2017.01)
  *H01L 27/11582* (2017.01)
  *H01L 27/1157* (2017.01)
  *H01L 27/11529* (2017.01)
  *H01L 27/11573* (2017.01)
  *H01L 21/683* (2006.01)
  *H01L 27/11524* (2017.01)
  *H01L 21/762* (2006.01)
  *H01L 21/78* (2006.01)
  *H01L 21/027* (2006.01)
  *H01L 21/033* (2006.01)
  *H01L 51/00* (2006.01)

(52) U.S. Cl.
  CPC ........ *H01L 21/568* (2013.01); *H01L 21/6835* (2013.01); *H01L 21/76254* (2013.01); *H01L 21/76259* (2013.01); *H01L 21/7813* (2013.01); *H01L 24/89* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01); *H01L 51/0016* (2013.01); *H01L 2221/68318* (2013.01); *H01L 2221/68363* (2013.01); *H01L 2221/68372* (2013.01); *H01L 2224/0347* (2013.01); *H01L 2224/1147* (2013.01); *H01L 2224/2747* (2013.01); *H01L 2224/80895* (2013.01)

(58) Field of Classification Search
  CPC ............. H01L 21/0331; H01L 21/0272; H01L 27/11573; H01L 27/1157; H01L 27/11529; H01L 21/6835; H01L 24/89; H01L 27/11556; H01L 27/11524; H01L 27/11582; H01L 2224/1147; H01L 2224/2747; H01L 2224/0347; H01L 51/0016; H01L 2224/80895; H01L 2221/68304–68322; H01L 2221/68363–68381
  See application file for complete search history.

(56) References Cited

U.S. PATENT DOCUMENTS

| | | | |
|---|---|---|---|
| 7,846,759 B2 | 12/2010 | Atwater, Jr. et al. | |
| 8,114,766 B1* | 2/2012 | Soejima | H01L 21/6835 438/618 |
| 8,153,504 B2* | 4/2012 | Allibert | H01L 24/33 438/455 |
| 8,536,629 B2* | 9/2013 | Tada | H01L 27/1203 257/288 |
| 8,728,863 B2* | 5/2014 | Nguyen | H01L 23/147 438/107 |
| 8,895,364 B1* | 11/2014 | Okandan | H01L 21/76251 438/113 |
| 8,993,410 B2* | 3/2015 | Henley | B26F 3/002 438/458 |
| 9,922,956 B2* | 3/2018 | Lan | H01L 27/0688 |
| 9,929,054 B2* | 3/2018 | Yonehara | B23K 26/082 |
| 10,115,681 B1 | 10/2018 | Ariyoshi | |
| 10,164,144 B2* | 12/2018 | Henley | H01L 21/02002 |
| 10,283,493 B1 | 5/2019 | Nishida | |
| 10,304,740 B2* | 5/2019 | Komatsu | C01F 17/34 |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 10,629,468 B2* | 4/2020 | Yota | H01L 23/5226 |
| 10,651,072 B2* | 5/2020 | Berger | H01L 21/7813 |
| 10,784,145 B2* | 9/2020 | Berger | H01L 21/2007 |
| 2003/0017712 A1* | 1/2003 | Brendel | H01L 21/76259 438/758 |
| 2003/0157783 A1* | 8/2003 | Fonash | B81C 99/008 438/458 |
| 2006/0021565 A1 | 2/2006 | Zahler et al. | |
| 2006/0112986 A1 | 6/2006 | Atwater, Jr. et al. | |
| 2006/0255341 A1 | 11/2006 | Pinnington et al. | |
| 2007/0243703 A1 | 10/2007 | Pinnington et al. | |
| 2012/0013013 A1 | 1/2012 | Sadaka et al. | |
| 2014/0084450 A1* | 3/2014 | Nielson | H01L 24/97 257/734 |
| 2015/0021741 A1* | 1/2015 | Lin | H01L 27/0688 257/618 |
| 2015/0187652 A1* | 7/2015 | Yamamoto | H01L 21/30612 438/458 |
| 2015/0348817 A1* | 12/2015 | Bodner | H01L 21/6835 156/60 |
| 2018/0019169 A1* | 1/2018 | Henley | H01L 21/6835 |
| 2018/0182654 A1 | 6/2018 | Uzoh | |
| 2018/0350785 A1* | 12/2018 | Fong | H01L 21/76254 |
| 2019/0006381 A1 | 1/2019 | Nakatsuji et al. | |
| 2019/0057959 A1* | 2/2019 | Or-Bach | H01L 27/14634 |
| 2019/0221557 A1 | 7/2019 | Kim et al. | |
| 2019/0252361 A1 | 8/2019 | Nishida | |

OTHER PUBLICATIONS

U.S. Appl. No. 16/248,923, filed Jan. 16, 2019, SanDisk Technologies LLC.
U.S. Appl. No. 16/231,752, filed Dec. 24, 2018, SanDisk Technologies LLC.
U.S. Appl. No. 16/274,687, filed Feb. 13, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/242,216, filed Jan. 8, 2019, SanDisk Technologies LLC.
U.S. Appl. No. 16/255,413, filed Jan. 23, 2019, SanDisk Technologies LLC.
U.S. Appl. No. 16/249,423, filed Jan. 16, 2019, SanDisk Technologies LLC.
U.S. Appl. No. 16/269,301, filed Feb. 6, 2019, SanDisk Technologies LLC.
U.S. Appl. No. 16/278,372, filed Feb. 18, 2019, SanDisk Technologies LLC.
U.S. Appl. No. 16/275,668, filed Feb. 14, 2019, SanDisk Technologies LLC.
U.S. Appl. No. 16/288,656, filed Feb. 28, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/417,913, filed May 21, 2019, SanDisk Technologies LLC.
U.S. Appl. No. 16/391,632, filed Apr. 23, 2019, SanDisk Technologies LLC.
U.S. Appl. No. 16/385,010, filed Apr. 16, 2019, SanDisk Technologies LLC.
U.S. Appl. No. 16/409,593, filed May 10, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.

(56) References Cited

OTHER PUBLICATIONS

U.S. Appl. No. 16/589,404, filed Oct. 1, 2019, SanDisk Technologies LLC.
Notification of Transmittal of the International Search Report and Written Opinion of the International Search Authority for International Patent Application No. PCT/US2020/023996, dated Jul. 24, 2020, 9 pages.

* cited by examiner

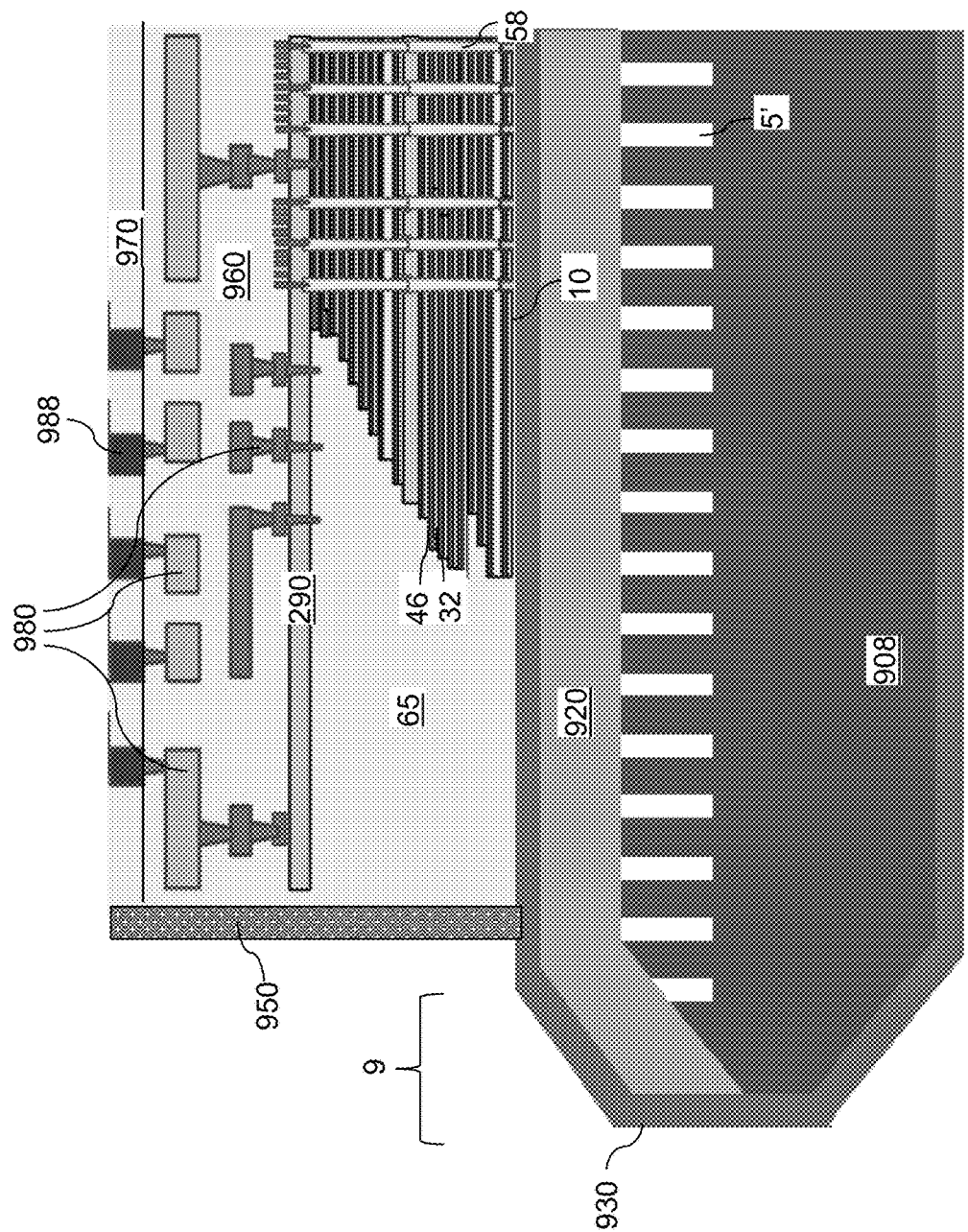

US 10,910,272 B1

REUSABLE SUPPORT SUBSTRATE FOR FORMATION AND TRANSFER OF SEMICONDUCTOR DEVICES AND METHODS OF USING THE SAME

FIELD

The present disclosure relates generally to the field of semiconductor devices, and particularly to a reusable support substrate for formation and transfer of semiconductor devices and methods of using the same.

BACKGROUND

Thinning of a substrate after formation of semiconductor devices thereupon can be desirable for packaging purposes. Two substrates with respective semiconductor devices thereupon can be bonded to form a bonded assembly. In this case, thinning or removal of at least one substrate can reduce the thickness of the bonded assembly to facilitate dicing and packaging of the semiconductor devices within the bonded assembly.

SUMMARY

According to an embodiment of the present disclosure, a method of forming a semiconductor structure is provided, which comprises: providing a support substrate comprising a plurality of channels located on a front side; forming a cover layer by anisotropically depositing a sacrificial cover material over the plurality of channels, wherein cavities laterally extend within the plurality of channels underneath a horizontally extending portion of the cover layer; conformally depositing an encapsulation layer on a top surface of the cover layer and on a backside surface of the support substrate; forming first semiconductor devices, first metal interconnect structures embedded in first dielectric material layers, and first bonding pads over a top surface of the encapsulation layer; providing a device substrate with second semiconductor devices, second metal interconnect structures embedded in second dielectric material layers, and second bonding pads thereupon; bonding the second bonding pads with the first bonding pads to form a bonded assembly; removing peripheral portions of the encapsulation layer, wherein peripheral portions of the cover layer are physically exposed; and removing the cover layer employing an isotropic etch process by propagating an isotropic etchant through the cavities to separate the support substrate from the bonded assembly.

According to another aspect of the present disclosure, a support substrate comprising a plurality of channels located on a front side and free of any channel on a backside is provided. Each of the plurality of channels directly extends to a peripheral region of the support substrate or is connected to another channel that directly extends to the peripheral region of the support substrate. Each point on the front side of the support substrate that is located outside of the plurality of channels is located within 300 microns from a most proximal one of the plurality of channels. Each channel within the plurality of channels has a depth-to-width ratio in a range from 1 to 100. Each channel width the plurality of channels has a depth in a range from 1 micron to 30 microns, and a width in a range from 100 nm to 5 microns. A ratio of a total area of the front side of the support substrate to a total area of the plurality of channels is in a range from 10 to 1,000,000.

BRIEF DESCRIPTION OF THE DRAWINGS

FIG. 5B is a schematic vertical cross-sectional view of a peripheral region of the exemplary structure of FIG. 5A.

DETAILED DESCRIPTION

Figure 1:
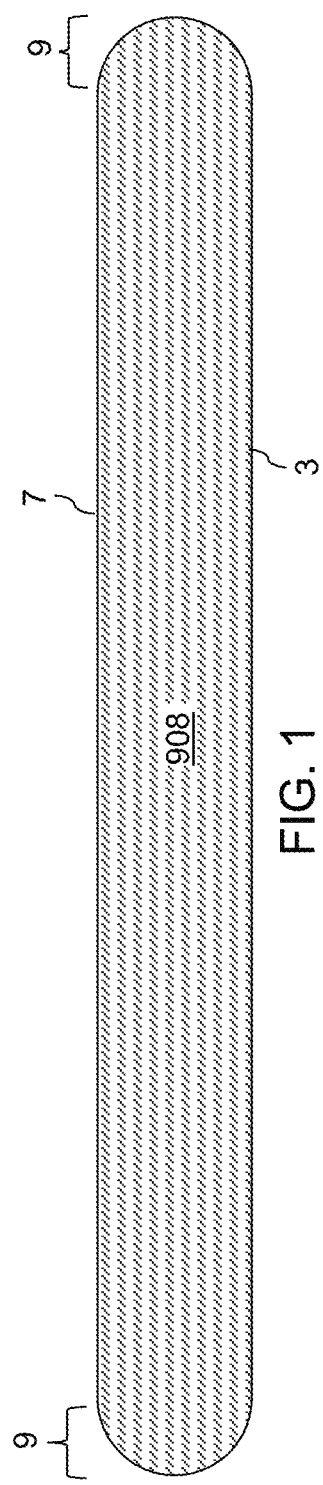
FIG. 1 is a schematic vertical cross-sectional view of a support substrate according to an embodiment of the present disclosure.

In a prior art bonded assembly fabrication process, a thinned or removed substrate is consumed during the manufacture process, and is not recycled. Thus, the total manufacturing cost for semiconductor chips containing a bonded assembly is higher than desired because it includes the cost of the thinned or removed substrate. The embodiments of the present disclosure are directed to a reusable support substrate for formation and transfer of semiconductor devices, such as three-dimensional memory and control devices, and methods of using the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a support substrate 908 according to an embodiment of the present disclosure is illustrated in a vertical cross-sectional view. The support substrate 908 can be a semiconductor substrate such as a commercially available silicon wafer having a maximum lateral dimension in a range from 50 mm to 1,000 mm, and having a thickness in a range from 300 microns to 3 mm, although lesser and greater diameters and/or thicknesses can also be employed. In one embodiment, the support substrate 908 can consist essentially of a semiconductor material such as single crystalline silicon, polysilicon, silicon carbide, a III-V compound semiconductor material such as GaN or AlGaN, a II-VI compound semiconductor material, or an organic semiconductor material. Alternatively, the support substrate 908 may comprise an insulating substrate, such as a ceramic, quartz or glass substrate, or a silicon on insulator (SOI) substrate. In one embodiment, the support substrate 908 may have a horizontal cross-sectional shape of a circle, a rectangle, or any closed two-dimensional curvilinear shape. In one embodiment, the support substrate 908 may be a commercially available single crystalline substrate having a circular horizontal cross-sectional shape such as a 300 mm single crystalline silicon substrate or a 450 mm single crystalline silicon wafer.

Figure 2A:
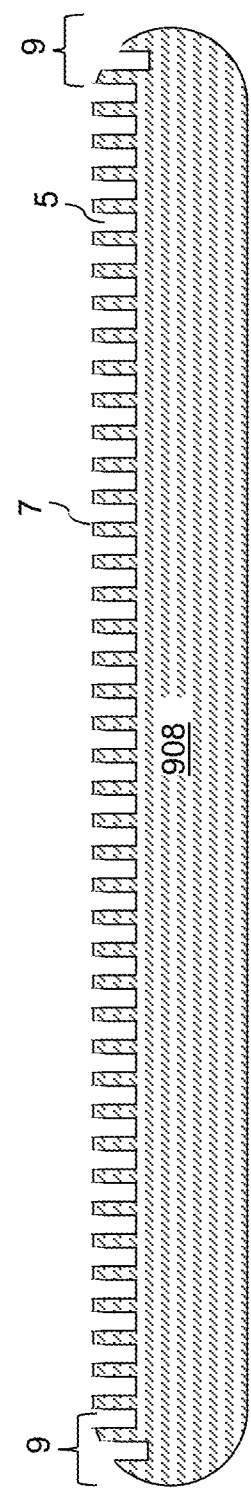
FIG. 2A is a schematic vertical cross-sectional view of the support substrate after formation of a plurality of channels on a front side according to an embodiment of the present disclosure.
Figure 2C:
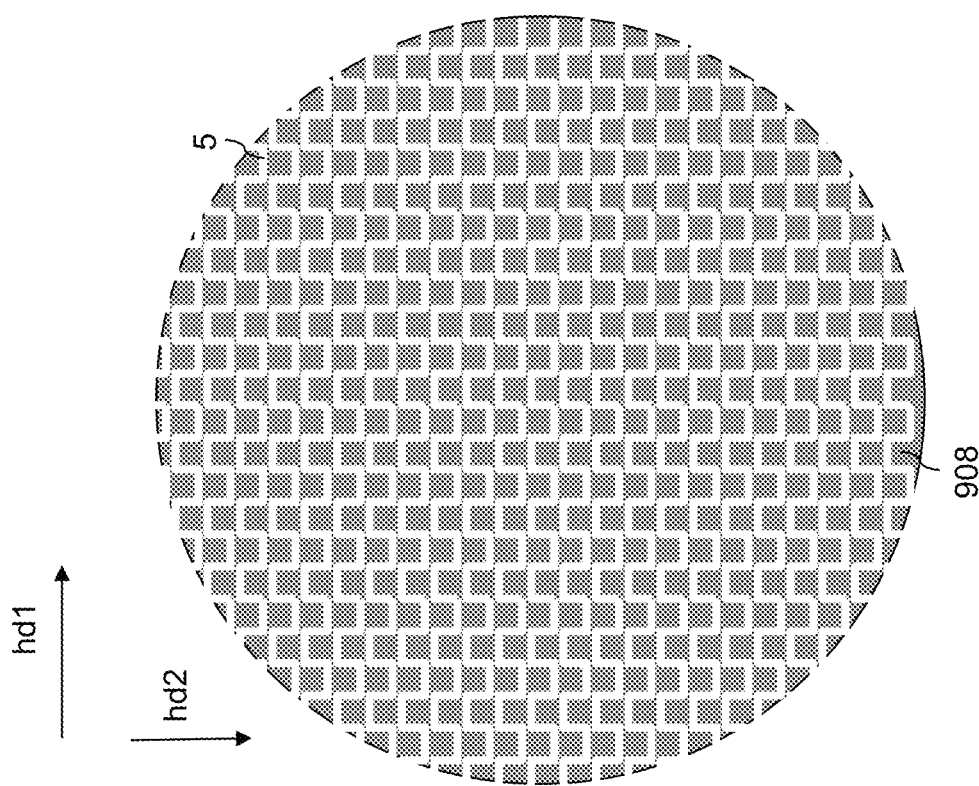
FIG. 2C is a schematic top-down view of a second configuration of the support substrate of FIG. 2A.
Figure 2B:
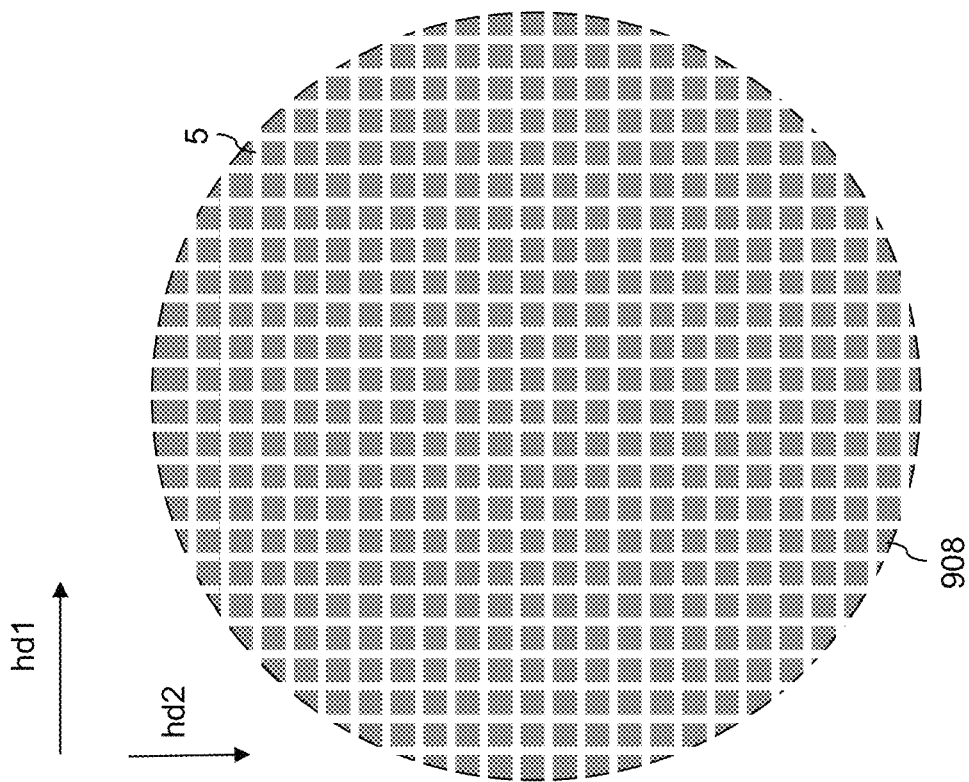
FIG. 2B is a schematic top-down view of a first configuration of the support substrate of FIG. 2A.
Figure 2D:
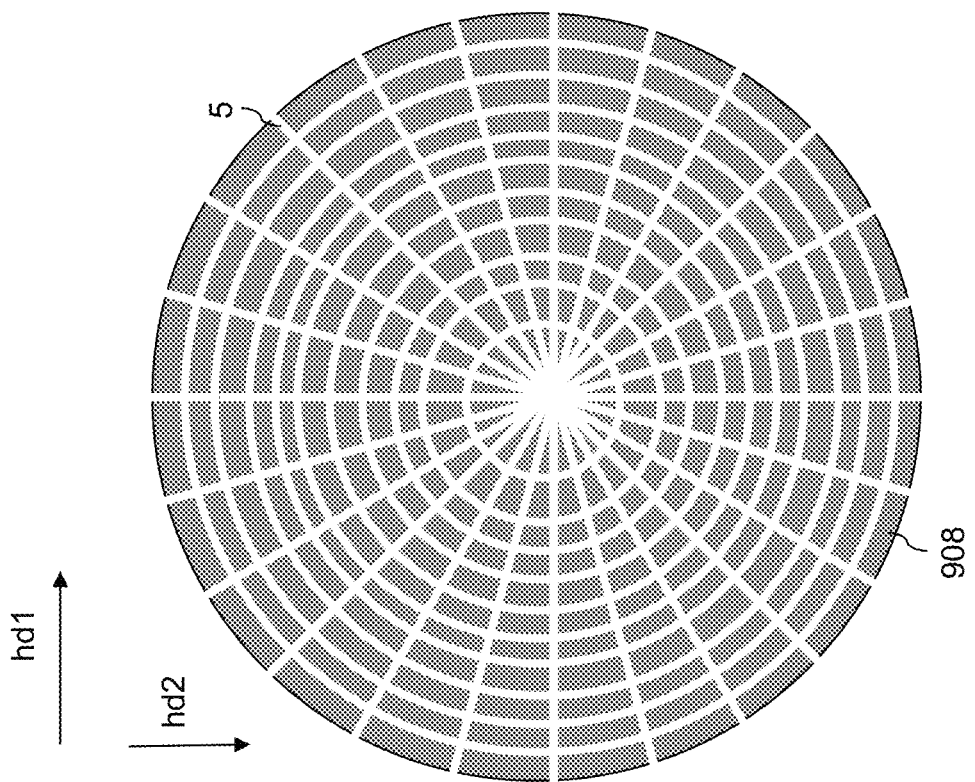
FIG. 2D is a schematic top-down view of a third configuration of the support substrate of FIG. 2A.

The support substrate 908 can have a front-side major substrate 7 and a backside major substrate 3. As used herein, a "major surface" of an element refers to a surface of the element that has a surface area of at least 50% of a surface of the element that has the largest surface area. The front-side major surface 7 is a major surface located on a front side of the support substrate 908, and the backside major surface 3 is a major surface located on a backside of the support substrate 908. The front-side major surface 7 of the support substrate 908 can include a tapered peripheral surface portion located at a peripheral (e.g., edge) region 9 of the front-side major surface 7. The peripheral region 9 can include the entire area of the front-side major surface 7 that has a non-horizontal surface segment. As used herein, a "surface segment" refers to any finite segment of a surface. The tapered peripheral surface portion includes segments of the front-side major surface 7 that are not horizontal. In one embodiment, the tapered peripheral surface portion of the front-side major surface 7 can have an annular shape. In one embodiment, the peripheral region 9 of the support substrate 908 includes a bevel region of the support substrate 908. As used herein, a "bevel region" refers to a region having a tapered front-side surface and/or a tapered backside surface to provide a lesser thickness than an adjacent region (i.e., a non-bevel region) having a uniform thickness Referring to FIGS. 2A-2D, a plurality of channels 5 can be formed on the front side of the support substrate 908 according to an embodiment of the present disclosure. As used herein, a "channel" refers to a laterally extending cavity. FIGS. 2B-2D illustrate various configurations for the plurality of channels 5. The plurality of channels 5 can be formed, for example, by forming a patterned etch mask layer (not shown) on the front-side major surface 7 of the support substrate 908, and by performing an etch process that transfers the pattern of the openings in the patterned etch mask layer into an upper portion of the support substrate 908. The patterned etch mask layer may be a patterned photoresist material layer, or may be a patterned hard mask layer including at least one dielectric material such as silicon nitride, undoped silicate glass, a doped silicate glass, a dielectric metal oxide material, and or a metallic material such as a conductive metal nitride material, a metal, or a metallic alloy. In case a patterned photoresist material layer is employed as the patterned etch mask layer, the patterned photoresist material layer can be directly patterned by lithographic exposure and development. In case a patterned hard mask layer is employed as the patterned etch mask layer, a photoresist material layer can be applied over a blanket (unpatterned) hard mask layer and can be lithographically patterned to form a patterned photoresist material layer. Subsequently, the pattern in the patterned photoresist material layer can be transferred through the blanket hard mask layer by an etch process to form the patterned hard mask layer.

Unmasked regions of the upper portion of the support substrate 908 that are not masked by the patterned etch mask layer are etched during the etch process. The etch process that transfers the pattern in the patterned etch mask layer into the upper portion of the support substrate 908 may employ an anisotropic etch process or an isotropic etch process. In case an isotropic etch process is employed to transfer the pattern into the upper portion of the support substrate 908, the spacing between geometrical centers of each neighboring pair of channels 5 is greater than the depth of the channels 5. In one embodiment, an anisotropic etch process may be employed to transfer the pattern of the patterned etch mask layer into the upper portion of the support substrate 908. In this case, the channels 5 can be formed as deep trenches having a depth greater than 1 micron. In one embodiment, each channel 5 of the plurality of channels 5 can have a depth in a range from 1 micron to 30 microns, although lesser and greater depths can also be employed. Each channel 5 of the plurality of channels 5 can have a width in a range from 100 nm to 5 microns. In one embodiment, each channel 5 within the plurality of channels 5 can have a depth-to-width ratio in a range from 1 to 100, and may have a depth-to-width ratio in a range from 4 to 25. In one embodiment, all channels 5 may have the same width and the same depth throughout.

The plurality of channels 5 include multiple channels 5 that laterally extend at least from one point at a peripheral region of the planar (horizontal) portion of the front-side major surface 7 of the support substrate 908 to another point at the peripheral region of the planar portion of the front-side major surface 7 of the support substrate 908. In one embodiment, at least 10%, such as at least 25%, of the channels 5 within the plurality of channels 5 can have a length that is at least 50% of the maximum lateral dimension of the support substrate 908. Various patterns can be employed for the plurality of channels 5 provided that each point on the planar portion of the front-side major surface 7 is within, or at, one of the channels 5, or is laterally spaced from a most proximal one of the channels 5 by a lateral separation distance that does not exceed a predetermined maximum lateral separation distance. In one embodiment, the predetermined lateral separation distance can be in a range from 20 microns to 300 microns. The predetermined maximum lateral separation distance can be the same as, or can be determined based on, the maximum lateral etch distance during an isotropic etch process to be subsequently performed for the material of a sacrificial substrate cover that is subsequently deposited over the front-side major surface 7 prior to the isotropic etch process. For example, the predetermined maximum lateral separation distance can be in a range from 2 times the width of each channel 5 to 100 times the width of each channel 5. In one embodiment, the predetermined maximum lateral separation distance can be in a range from 5 times the width of each channel 5 to 25 times the width of each channel 5. The total area of the plurality of channels 5 can be in a range from 0.0001% of the total area of the front-side major surface 7 to 10% of the total area of the front-side major surface 7. In one embodiment, the total area of the plurality of channels 5 can be in a range from 0.001% of the total area of the front-side major surface 7 to 1% of the total area of the front-side major surface 7.

In an embodiment illustrated in FIG. 2B, the plurality of channels 5 can comprise first channels that laterally extend straight along a first horizontal direction hd1 from a respective first end point at a peripheral region of the support substrate 908 to a respective second end point at a peripheral region of the support substrate 908, and second channels that laterally extend straight along a second horizontal direction hd2 (where hd2 is perpendicular to hd1) from a respective first end point at the peripheral region of the support substrate 908 to a respective second end point at a peripheral region of the support substrate 908 and intersecting a respective subset of the first channels.

In an embodiment illustrated in FIG. 2C, the plurality of channels 5 can comprise a plurality of serpentine channels that extend along a first horizontal direction hd1 from a respective first end point at a peripheral region of the support substrate 908 to a respective second end point at the peripheral region of the support substrate 908 with a lateral undulation along a second horizontal direction hd2 that is perpendicular to the first horizontal direction hd1. At least one serpentine channel may include at least two sets of straight segments that laterally extend along the first horizontal direction hd1 and aligned along the first horizontal direction hd1 (i.e., without an offset along the second horizontal direction hd2) and connecting segments that connect straight segments that belong to different sets of straight segments. Alternatively or additionally, at least one serpentine channel may include curved channel segments that generally extend along the first horizontal direction hd1, the second horizontal direction hd2, or any horizontal direction therebetween.

In an embodiment illustrated in FIG. 2D, the plurality of channels 5 comprise radial channels that extend straight radially from a respective first end point at a peripheral region of the support substrate 908 to a respective second end point that is more proximal to a vertical axis passing through a geometrical center of the support substrate than to the peripheral region of the support substrate 908, and azimuthal channels that are located at a respective horizontal distance from the vertical axis passing through the geometrical center of the support substrate 908 and intersecting a respective subset of the support substrate 908. The center of the support substrate 908 refers to a geometrical center of the support substrate 908.

In one embodiment, the support substrate 908 illustrated in FIGS. 2A-2D can include a plurality of channels 5 located on a front side and free of any channel on a backside. Each of the plurality of channels 5 directly extends to a peripheral region of the support substrate 908 or is connected, directly or indirectly, to another channel 5 that directly extends to the peripheral region of the support substrate 908. Each point on the front side of the support substrate 908 that is located outside of the plurality of channels 5 is located within the predetermined maximum lateral distance from a most proximal one of the plurality of channels 5. In one embodiment, each point on the front side of the support substrate 908 that is located outside of the plurality of channels 5 is located within 300 microns from a most proximal one of the plurality of channels 5. In one embodiment, each channel 5 within the plurality of channels 5 has a depth-to-width ratio in a range from 1 to 100. In one embodiment, each channel 5 of the plurality of channels 5 has a depth in a range from 1 micron to 30 microns, and a width in a range from 100 nm to 5 microns. In one embodiment, a ratio of a total area of the front side of the support substrate 908 to a total area of the plurality of channels is in a range from 10 to 1,000,000.

Figure 3A:
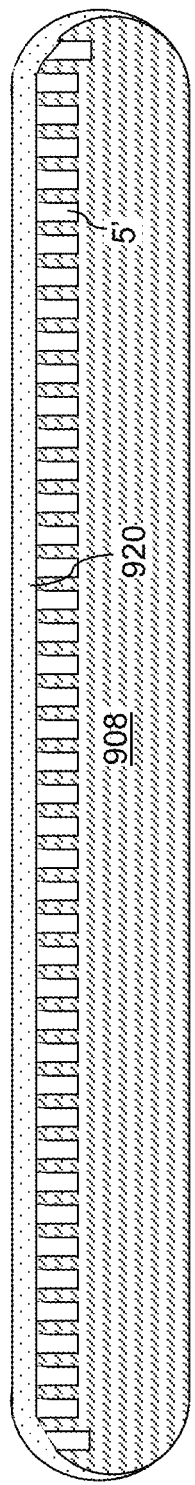
FIG. 3A is a schematic vertical cross-sectional view of an exemplary structure including the support substrate and a cover layer thereupon according to an embodiment of the present disclosure.
Figure 3B:
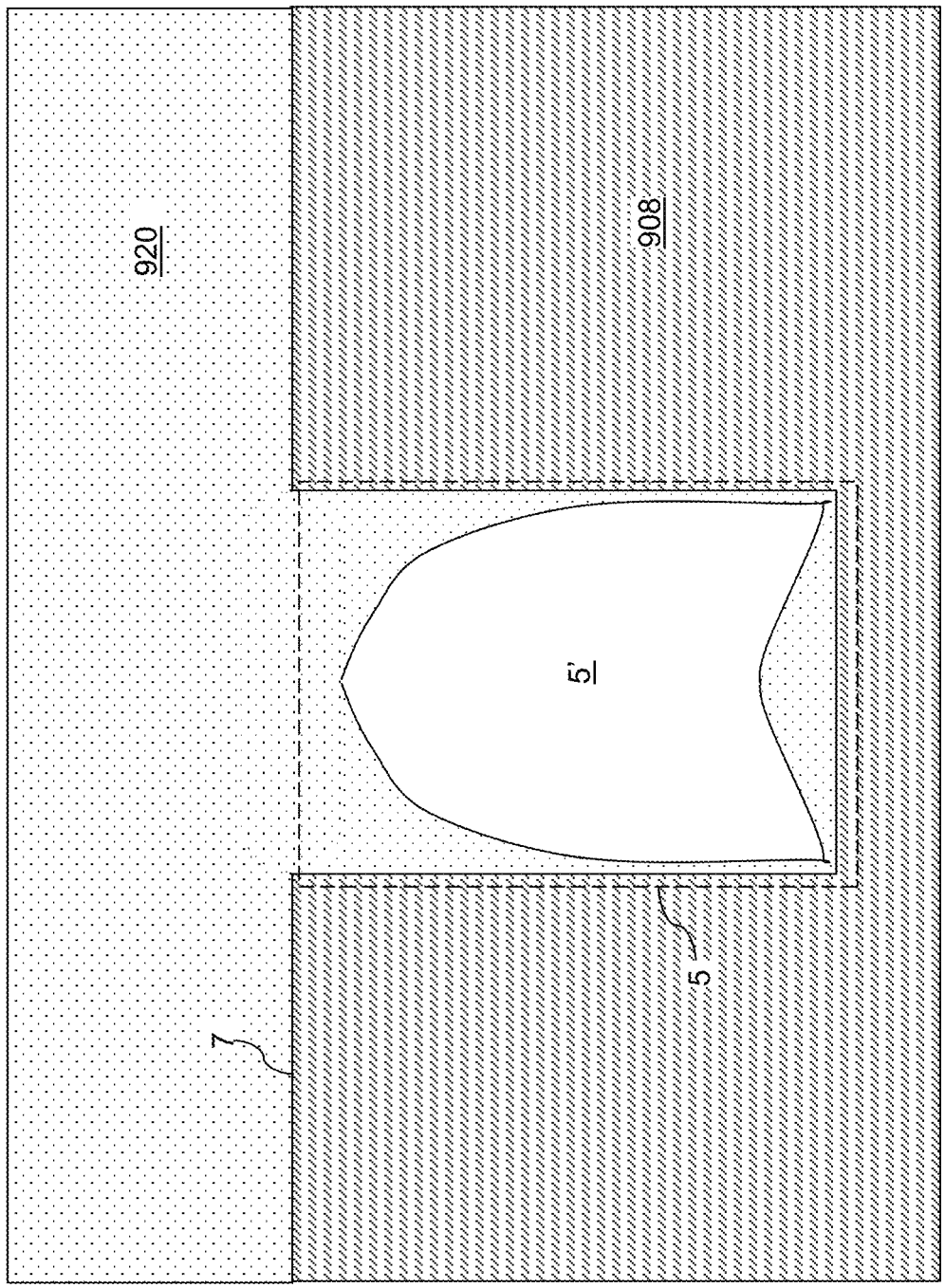
FIG. 3B is a magnified view of a region of the schematic vertical cross-sectional view of FIG. 3A.

Referring to FIGS. 3A and 3B, a sacrificial material that can be removed selective to the material of the support substrate 908 can be anisotropically deposited over the front-side major surface 7 of the support substrate 908. As used herein, removal of a first material is "selective to" a second material if the removal rate of the first material is greater than the removal rate of the second material by a factor of at least 10. For example, if the support substrate 908 consists essentially of a semiconductor material, such as silicon, then the sacrificial material can include borosilicate glass, borophosphosilicate glass, organosilicate glass, silicon nitride, germanium, or a silicon-germanium alloy. In one embodiment, the sacrificial material may be selected from a doped silicate glass, organosilicate glass, and a silicon-germanium alloy. If a silicon-germanium alloy is employed, the silicon-germanium alloy can include germanium at an atomic concentration greater than 25% (which may be greater than 50%). Generally, the sacrificial material can be a material that can be selectively etched in an isotropic etch process selective to the material of the support substrate 980, i.e., without significantly etching the material of the support substrate. For example, if the sacrificial material includes borosilicate glass, borophosphosilicate glass, or organosilicate glass, a wet etch process employing a hydrofluoric acid-based solution can etch the sacrificial material selective to the semiconductor material. If the sacrificial material includes silicon nitride, a wet etch process employing a hot phosphoric acid can etch the sacrificial material selective to the semiconductor material. If the sacrificial material includes germanium or a silicon-germanium alloy, a wet etch process employing a hot phosphoric acid can etch the sacrificial material selective to the semiconductor material.

The anisotropic deposition of the sacrificial forms a cover layer 920 over the front-side major surface 7 of the support substrate 908. The anisotropic deposition process that can be employed to deposit the cover layer 920 can be a non-conformal chemical vapor deposition process (such as a plasma-enhanced chemical vapor deposition (PECVD) process) or a physical vapor deposition process. The anisotropic nature of the deposition process causes formation of a sacrificial material over the front-side major surface 7 of the support substrate 908 with a greater thickness than on bottom surfaces of the channels 5 or on sidewalls of the channels 5. Further, the lateral thickness of the deposited sacrificial material in each sidewall of the channels 5 decreases with a downward distance from the horizontal plane including the front-side major surface 7. The duration of the anisotropic deposition process can be selected such that portions of the sacrificial material that grow from the sidewalls of the channels 5 merge to form cavities 5' that are disconnected from the ambient by a continuously extending horizontal portion of the cover layer 920 that covers the entire area of the front-side major surface 7 and the entire area of the channels 5. The cavities 5' can be encapsulated cavities defined by, and entirely contained within, surfaces of the cover layer 920. Thus, the cavities 5' laterally extend within the plurality of channels 5 underneath a horizontally extending portion of the cover layer 920. Each cavity 5' may overlie a respective bottom portion of the cover layer 920 having a convex top surface and may be laterally bounded by at least one pair of tapered sidewall portions of the cover layer 920 that has a variable lateral thickness that increases with a vertical distance from a horizontal plane including the bottom surfaces of the channels 5. Each cavity 5' may include an arched ceiling at which a pair of tapered sidewalls of the cover layer 920. A ridge can laterally extend at the top of each cavity 5' along the local lengthwise direction of the cavity 5'. The thickness of the horizontally extending portion of the cover layer 920 can be in a range from 500 nm to 20 microns, such as from 1 micron to 10 microns, although lesser and greater thicknesses can also be employed for the horizontally extending portion of the cover layer 920.

Figure 4A:
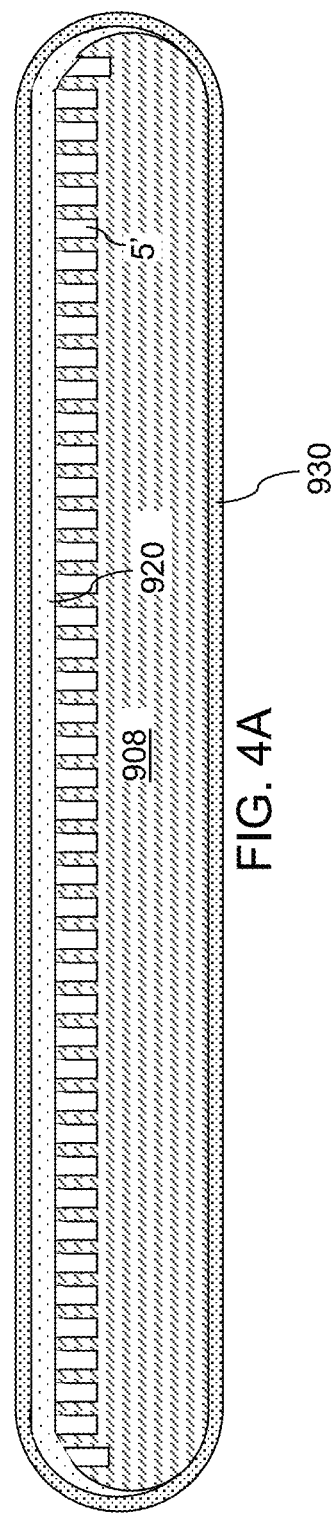
FIG. 4A is a schematic vertical cross-sectional view of the exemplary structure after formation of an encapsulation layer according to an embodiment of the present disclosure.
Figure 4B:
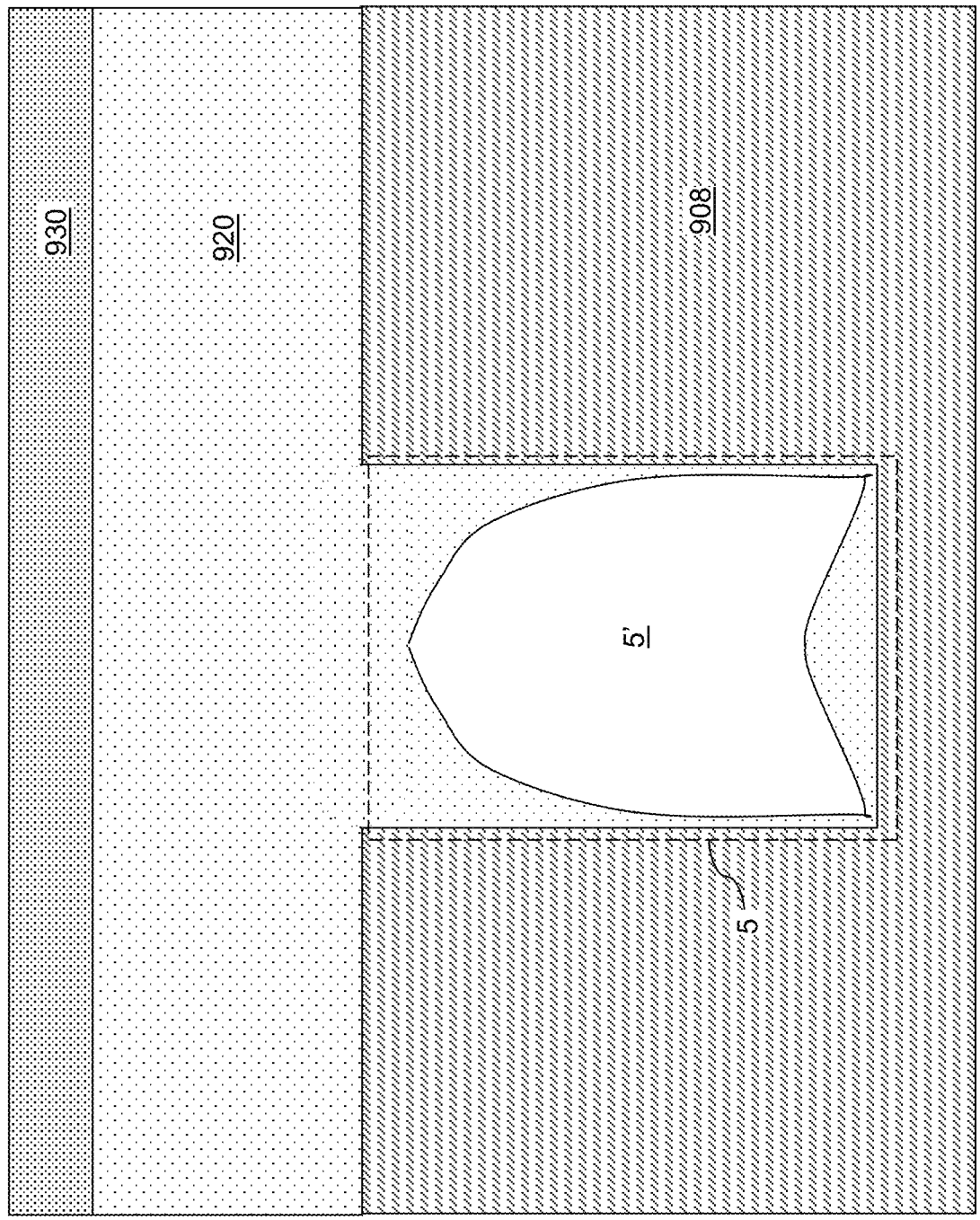
FIG. 4B is a magnified view of a region of the schematic vertical cross-sectional view of FIG. 4A.

Referring to FIGS. 4A and 4B, an encapsulation layer 930 can be conformally deposited on the physically exposed surfaces of the cover layer 920 and the support substrate 908. Thus, the encapsulation layer 930 can be deposited on the front-side surface of the cover layer 920 and on the backside surface of the support substrate 908. The encapsulation layer 930 includes a material that is resistant to the etch chemistry of the isotropic etch process to be subsequently employed to remove the cover layer 920. For example, if the cover layer 920 includes undoped silicate glass, a doped silicate glass, organosilicate glass, or a silicon-germanium alloy, the encapsulation layer 930 can include silicon nitride and/or a dielectric metal oxide. If the cover layer 920 includes silicon nitride, the encapsulation layer 930 can include a dielectric metal oxide (such as aluminum oxide, hafnium oxide, and/or zirconium oxide). In one embodiment, the encapsulation layer 930 comprises, and/or consists essentially of, a dielectric metal oxide material, such as aluminum oxide. The conformal deposition process that deposits the encapsulation layer 930 can include, for example, a low pressure chemical vapor deposition (LPCVD) process and/or an atomic layer deposition (ALD) process. The thickness of the encapsulation layer 930 can be in a range from 20 nm to 1 micron, such as from 50 nm to 3,000 nm, although lesser and greater thicknesses can also be employed.

Figure 5A:
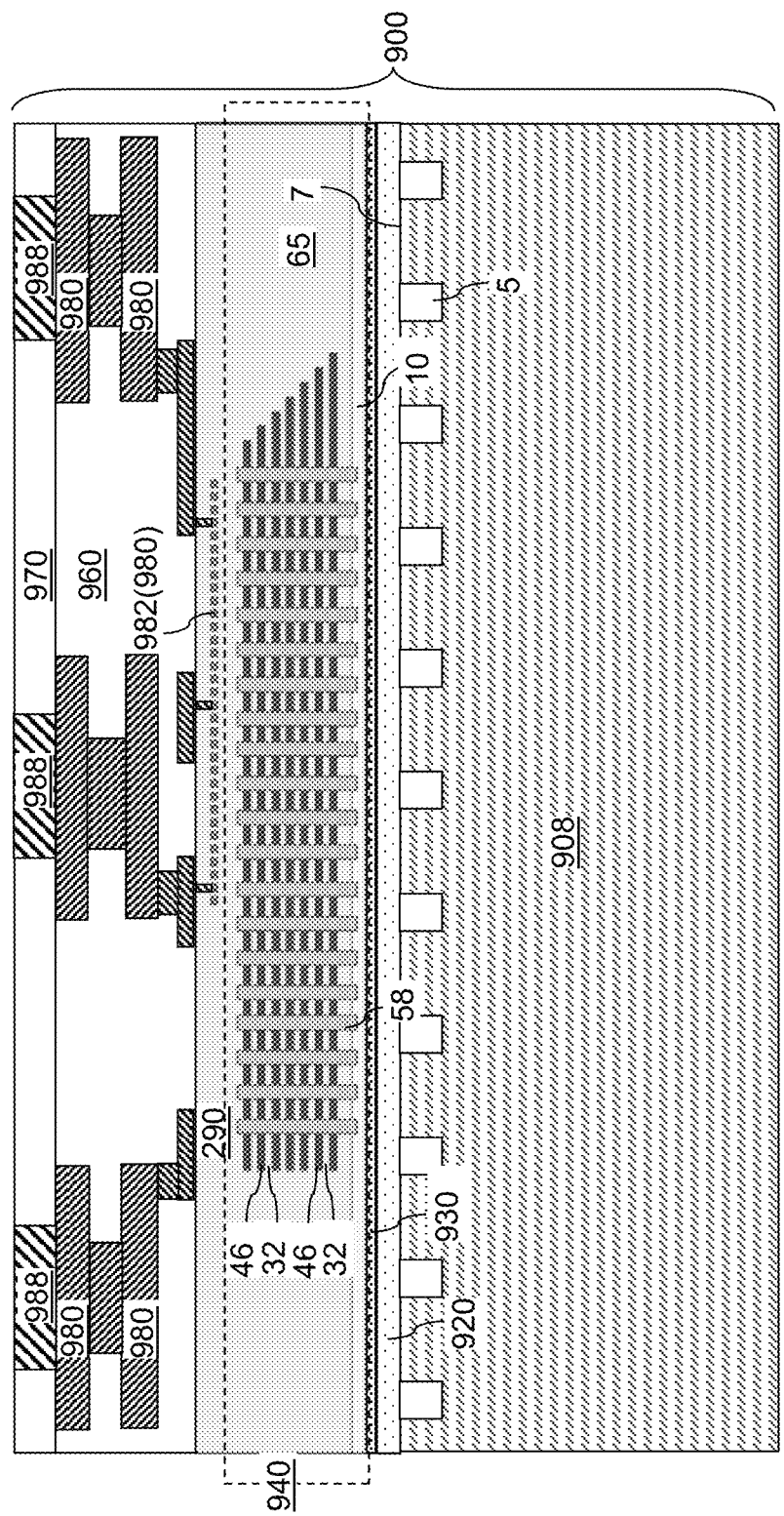
FIG. 5A is a schematic vertical cross-sectional view of a center region of the exemplary structure after formation of first semiconductor devices, first metal interconnect structures, first dielectric material layers, and first metal pads according to an embodiment of the present disclosure.

Referring to FIGS. 5A and 5B, a first semiconductor structure 900 according to an embodiment of the present disclosure is illustrated. The cavities 5' are omitted for clarity in FIGS. 5A and 5B. The first semiconductor structure 900 can be provided by forming first semiconductor devices 940 on the assembly of the support substrate 908, the cover layer 920, and the encapsulation layer 930. First dielectric material layers (290, 960, 970) can be subsequently formed over the first semiconductor devices 940, and first metal interconnect structures 980 can be embedded in the first dielectric material layers (290, 960, 970). Generally, the first semiconductor devices 940 may comprise any semiconductor devices known in the art. In one embodiment, the first semiconductor structure 900 can include a two-dimensional array of memory dies formed on the support substrate 908. Each of the memory dies can include memory devices, such as three-dimensional NAND memory devices.

In one embodiment, the first semiconductor devices 940 may include a three-dimensional array of memory elements located within a two-dimensional array of vertical NAND strings. In an illustrative example, the first semiconductor devices 940 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical channel contacting the memory film. The memory film may include a blocking dielectric, a tunneling dielectric and a charge storage material located between the blocking and tunneling dielectric. The charge storage material may comprise a charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal channel layer 10 connected to the bottom end of each vertical channel.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

In one embodiment, each three-dimensional memory device can include an alternating stack of insulating layers 32 and electrically conductive layers 46, and a two-dimensional array of vertical NAND strings that vertically extend through the alternating stack (32, 46). Each of the vertical NAND strings comprises a respective vertical stack of memory elements (which may be non-volatile memory elements), and the two-dimensional array of vertical NAND strings comprises the three-dimensional array of memory elements.

The first dielectric material layers (290, 960, 970) may include first contact-level dielectric layers 290 embedding contact via structures and bit lines 982, first interconnect-level dielectric layers 960 that embed a subset of the first metal interconnect structures 980 located above the first contact-level dielectric layers 290, and a first bonding dielectric layer 970 that is formed above the first interconnect-level dielectric layer 960. The bit lines 982 are a subset of the first metal interconnect structures 980 and may electrically contact drain regions located above the channel at the top of the memory opening fill structures 58. Interconnect metal lines and interconnect metal via structures, which are subsets of the first metal interconnect structures 980) may be embedded in the first interconnect-level dielectric layers 960. The first metal interconnect structures 980 may be located within the first interconnect-level dielectric layers 960 or within the first bonding dielectric layer 970.

Each of the first contact-level dielectric layers 290 and the first interconnect-level dielectric layers 960 may include a dielectric material such as undoped silicate glass, a doped silicate glass, organosilicate glass, silicon nitride, a dielectric metal oxide, or a combination thereof. The first bonding dielectric layer 970 may include, and/or consist essentially of, a silicon oxide material such as undoped silicate glass (e.g., silicon oxide) or a doped silicate glass. The thickness of the first bonding dielectric layer 970 may be in a range from 100 nm to 3,000 nm, although lesser and greater thicknesses may also be employed. The first bonding dielectric layer 970 may have a planar top surface, which may be provided, for example, by a planarization process such as a chemical mechanical polishing (CMP) process. A topmost layer of the first interconnect-level dielectric layers 960 may be a dielectric diffusion barrier layer (not expressly shown), which may be a silicon nitride layer having a thickness in a range from 10 nm to 300 nm.

First bonding pads 988 are formed in the first bonding dielectric layer 970, for example, by forming pad cavities in the first bonding dielectric layer 970 and filling the pad cavities with at least one conductive material. Alternatively, the bonding pads 988 are formed on the first metal interconnect structures 980 first, followed by forming the first bonding dielectric layer 970 over and around the first bonding pads 988, followed by planarizing the first bonding dielectric layer 970 to expose the top surface of the first bonding pads 988. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP.

Each of the first bonding pads 988 is surrounded by the first bonding dielectric layer 970 and contacts a respective underlying one of the first metal interconnect structures 980.

Each of the first bonding pads 988 is electrically connected to a respective node of the first semiconductor devices 940.

According to an aspect of the present disclosure, a masking material layer such as a photoresist layer can be applied over a top surface of the first semiconductor structure 900. The masking material layer is patterned to cover an entire area within a periphery of the planar portion of the front-side major surface 7 of the support substrate 908, without covering non-planar surface segments of the front-side major surface 7. In one embodiment, tapered and/or non-horizontal segments of the front-side major surface 7 located within the peripheral region of the support substrate 908 are not covered by the masking material layer.

An anisotropic etch is performed to remove portions of the first dielectric material layers (290, 960, 970) and the dielectric material portions 65 that are not masked by the masking material layer from the bevel region. The bevel region is located in the peripheral region 9 of the support substrate 908, and includes beveled portions of the front surface (i.e., the front-side major surface 7) of the support substrate 908. The anisotropic etch process can etch through the materials of the first dielectric material layers (290, 960, 970) and the dielectric material portions 65, and can include a terminal etch step that employs an etch chemistry that is selective to the material of the encapsulation layer 930. For example, if the first dielectric material layers (290, 960, 970) and the dielectric material portions 65 include silicon oxide-based materials (such as undoped silicate glass or doped silicate glass materials), and if the encapsulation layer 930 includes a dielectric metal oxide material (such as aluminum oxide) or silicon nitride, the chemistry of the terminal step of the anisotropic etch process can be selected to etch the silicon oxide-based materials selective to the dielectric metal oxide material or silicon nitride. The peripheral portions of the encapsulation layer 930 can be physically exposed by the anisotropic etch process.

A passivation dielectric material can be deposited on physically exposed surfaces located on an upper side of the first exemplary structure 900. The passivation dielectric material includes a material that can block diffusion of hydrogen, moisture, and/or metallic impurities. For example, the passivation dielectric material can include silicon nitride. The passivation dielectric material can be deposited by a conformal deposition process or a non-conformal deposition process to form a passivation dielectric material layer that continuously covers the physically exposed surfaces on the front side of the first semiconductor structure 900. For example, plasma-enhanced chemical vapor deposition (PECVD) can be employed to deposit the passivation dielectric material layer. In case the encapsulation layer 930 includes silicon nitride, the thickness of vertical portions of the passivation dielectric material layer can be greater than the thickness of the encapsulation layer 930. The passivation dielectric material layer can be formed on the physically exposed sidewall surfaces of the first dielectric material layers (290, 960, 970) and the dielectric material portions 65, and on tapered surfaces of the encapsulation layer 930 located over the peripheral region of the support substrate 908.

An anisotropic etch process can be performed to remove horizontal portions of the passivation dielectric material layer overlying the first dielectric material layers (290, 960, 970), and to remove tapered portions of the passivation dielectric material layer overlying tapered portions of the bevel region in the peripheral region 9 of the support substrate 908. A remaining vertical portion that laterally surrounds the first semiconductor devices 940 and the first dielectric material layers (290, 960, 970) constitutes a passivation dielectric spacer 950. The passivation dielectric spacer 950 can have a tubular configuration, and can vertically extend from a top surface of an upper portion of the encapsulation layer 930 that overlies the support substrate 908 to a topmost layer within the first dielectric material layers (290, 960, 970). In one embodiment, the passivation dielectric spacer 950 can include an inner cylindrical sidewall and an outer cylindrical sidewall. Generally, the passivation dielectric spacer 950 can be formed on a physically exposed sidewall of the first dielectric material layers (290, 960, 970) by conformally depositing and anisotropically etching the passivation dielectric material. In one embodiment, the passivation dielectric spacer 950 can comprise, and/or can consist essentially of, silicon nitride.

Figure 6:
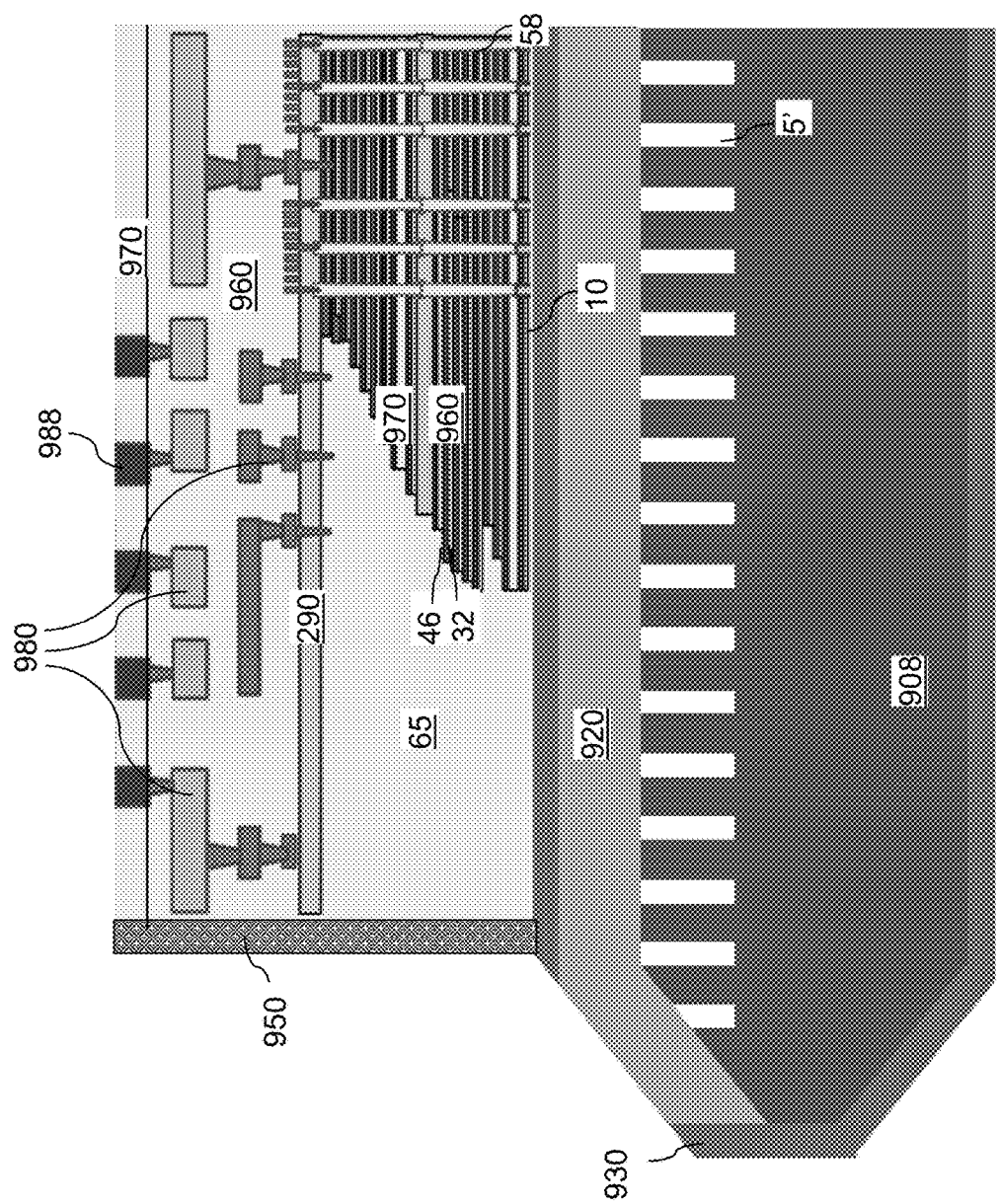
FIG. 6 is a schematic vertical cross-sectional view of a peripheral region of the exemplary structure after removing peripheral portions of the encapsulation layer according to an embodiment of the present disclosure.

Referring to FIG. 6, an etch process can be performed to remove at least the peripheral portions of the encapsulation layer 930. In one embodiment, the etch process may include an anisotropic etch process that etches the peripheral portions of the encapsulation layer 930 that overlies the bevel region of the support substrate 908 selective to the materials of the first bonding dielectric layer 970 and the first bonding pads 988. In this case, bottom portions of the encapsulation layer 930 located on the backside major surface of the support substrate 908 are not removed. Alternatively, the etch process may include an isotropic etch process, such as a wet etch process, that etches the material of the encapsulation layer 930 selective to the materials of the first bonding dielectric layer 970 and the first bonding pads 988. In this case, bottom portions of the encapsulation layer 930 located on the backside major surface of the support substrate 908 are removed by the isotropic etch process. Yet alternately, a terminal step of the anisotropic etch process that forms the passivation dielectric spacer 950 can have an etch chemistry that etches the material of the encapsulation layer 930. In this case, the structure illustrated in FIG. 6 can be provided at the end of the processing steps of FIGS. 5A and 5B. Upon removal of the peripheral portions of the encapsulation layer 930, peripheral portions of the cover layer 920 are physically exposed within the area of the bevel region of the support substrate 908.

Figure 7:
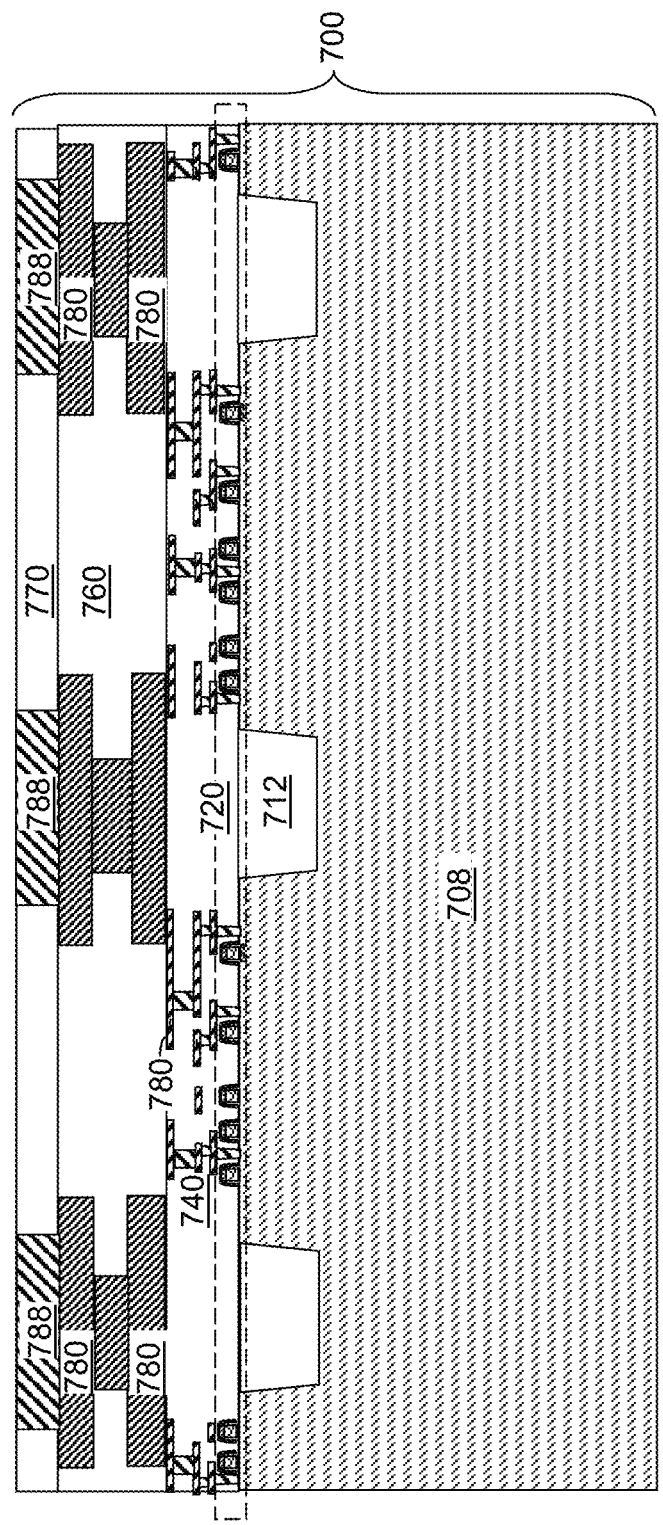
FIG. 7 is a schematic vertical cross-sectional view of a center region of an assembly of a device substrate, second semiconductor devices, second metal interconnect structures, second dielectric material layers, and second metal pads according to an embodiment of the present disclosure.

Referring to FIG. 7, a second semiconductor structure 700 is illustrated. The second semiconductor structure 700 includes a substrate which is herein referred to as a device substrate 708, second semiconductor devices 720 overlying the device substrate 708, second dielectric material layers (740, 760, 770) overlying the second semiconductor devices 720, and second metal interconnect structures 780 embedded in the second dielectric material layers (740, 760, 770). In one embodiment, the second semiconductor devices 720 may include at least one complementary metal oxide semiconductor (CMOS) circuitry including field effect transistors. In one embodiment, the device substrate 708 may be a commercially available silicon wafer having a thickness in a range from 500 microns to 1 mm.

Generally, the second semiconductor devices 720 may comprise any semiconductor device that may be operated in conjunction with the first semiconductor devices 940 in the first semiconductor structure 900 to provide enhanced functionality. In one embodiment, the first semiconductor structure 900 comprises a memory die and the second semiconductor structure 700 comprises a logic die that includes a support circuitry (i.e., a peripheral circuitry, e.g., driver circuitry) for operation of memory devices (such as a three-dimensional array of memory elements) within the memory die. In one embodiment, the first semiconductor structure 900 may include a three-dimensional memory device including a three-dimensional array of memory elements, word lines (that may comprise a subset of the electrically conductive lines 46), and bit lines 982, and the second semiconductor devices 720 of the second semiconductor structure 700 may include a logic circuit configured to control operation of the three-dimensional array of memory elements.

The peripheral circuitry may include one or more word line driver circuits that drive the word lines of the three-dimensional array of memory elements of the first semiconductor structure 900, one or more bit line driver circuits that drive the bit lines 982 of the first semiconductor structure 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor structure 900, a source power supply circuit that provides power to the horizontal channel layer 10 in the first semiconductor structure 900, a data buffer and/or latch, and/or any other semiconductor circuit that may be used to operate three-dimensional memory device of the first semiconductor structure 900.

The second dielectric material layers (740, 760, 770) may include proximal interconnect-level dielectric layers 740 embedding a proximal subset of the second metal interconnect structures 780 that is proximal to the device substrate 708, distal interconnect-level dielectric layers 760 embedding a distal subset of second metal interconnect structures 780 that is distal from the device substrate 708, and a second bonding dielectric layer 770 that is formed above the distal interconnect-level dielectric layers 760. The second metal interconnect structures 780 may be located within the proximal interconnect-level dielectric layer 740, within the distal interconnect-level dielectric layers 760, or within the second bonding dielectric layer 770.

The proximal interconnect-level dielectric layers 740 and the distal interconnect-level dielectric layers 760 may include a dielectric material such as undoped silicate glass (e.g., silicon oxide), a doped silicate glass, organosilicate glass, silicon nitride, a dielectric metal oxide, or a combination thereof. The second bonding dielectric layer 770 may include undoped silicate glass or a doped silicate glass (e.g., a doped or undoped silicon oxide material). The thickness of the second bonding dielectric layer 770 may be in a range from 100 nm to 3,000 nm, although lesser and greater thicknesses may also be employed. The second bonding dielectric layer 770 may have a planar top surface, which may be provided, for example, by a planarization process such as a chemical mechanical polishing (CMP) process.

Second bonding pads 788 are formed in the second bonding dielectric layer 770, for example, by forming pad cavities in the second bonding dielectric layer 770 and filling the pad cavities with at least one conductive material. Alternatively, the bonding pads 788 are formed on the second metal interconnect structures 780 first, followed by forming the second bonding dielectric layer 770 over and around the second bonding pads 788, followed by planarizing the second bonding dielectric layer 770 to expose the top surface of the second bonding pads 788. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP. The material of the second bonding pads 788 may be the same as, or may be different from, the material of the first bonding pads 988.

Each of the second bonding pads 788 is embedded in the second bonding dielectric layer 770 and contacts a respective underlying one of the second metal interconnect structures 780. Each of the second bonding pads 788 is electrically connected to a respective node of the second semiconductor devices 720.

The types of devices of the first semiconductor structure 900 and of the second semiconductor structure 700 may be selected in any manner such that the first semiconductor devices 940 of the first semiconductor structure 900 and the second semiconductor devices 720 of the second semiconductor structure 700 may communicate with each other, and optionally control, and or are controlled by, devices in the other semiconductor die. In one embodiment, one of the first semiconductor structure 900 and the second semiconductor structure 700 comprises a memory die including memory elements, such as a three-dimensional array of memory elements, and another of the first semiconductor structure 900 and the second semiconductor structure 700 comprises a logic die including peripheral circuitry configured to operate the memory elements, such as the three-dimensional array of memory elements.

Figure 8A:
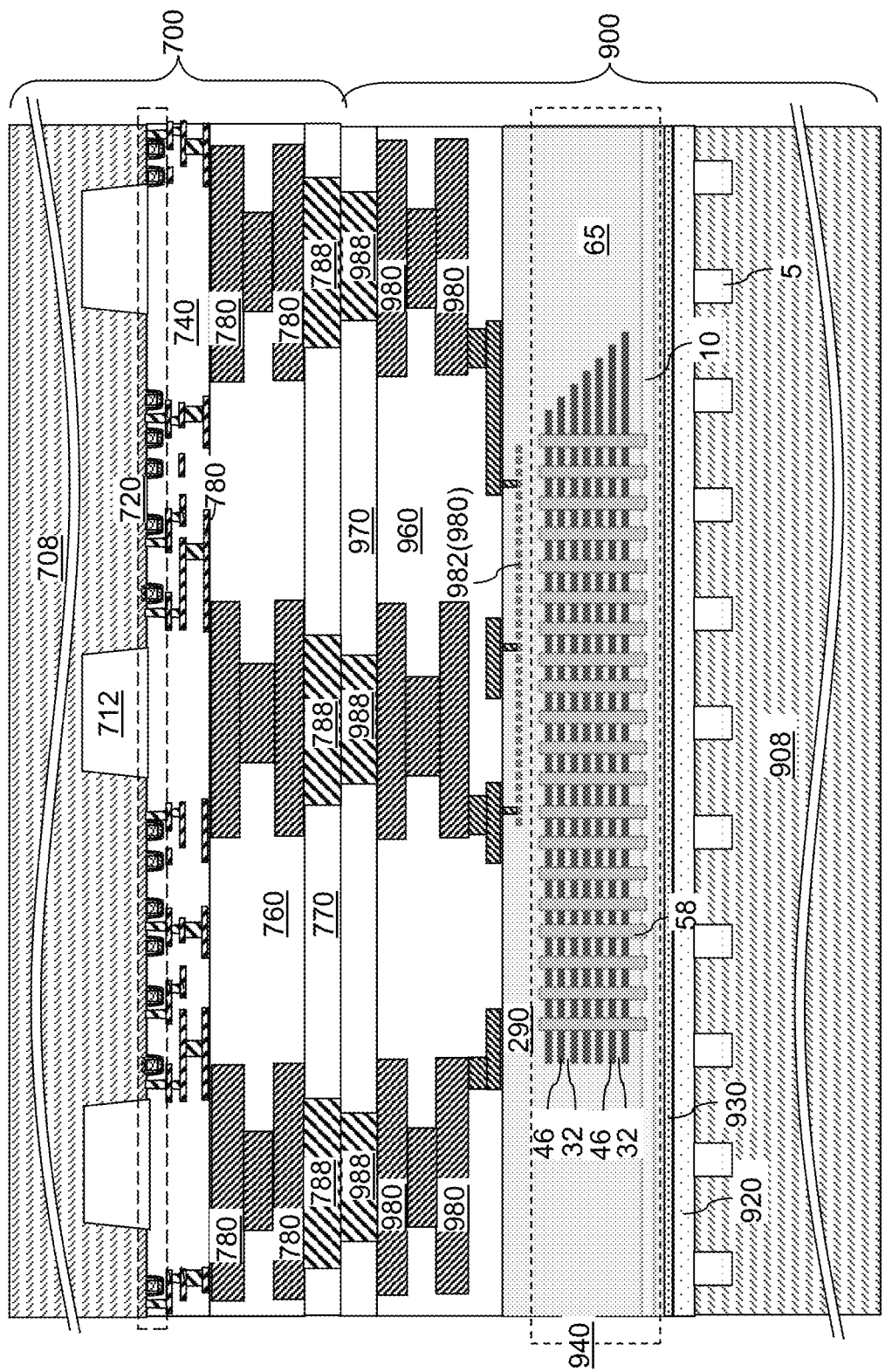
FIG. 8A is a schematic vertical cross-sectional view of a center region of a bonded assembly including the support substrate and structures thereupon and the device substrate and structures thereupon according to an embodiment of the present disclosure.
Figure 8B:
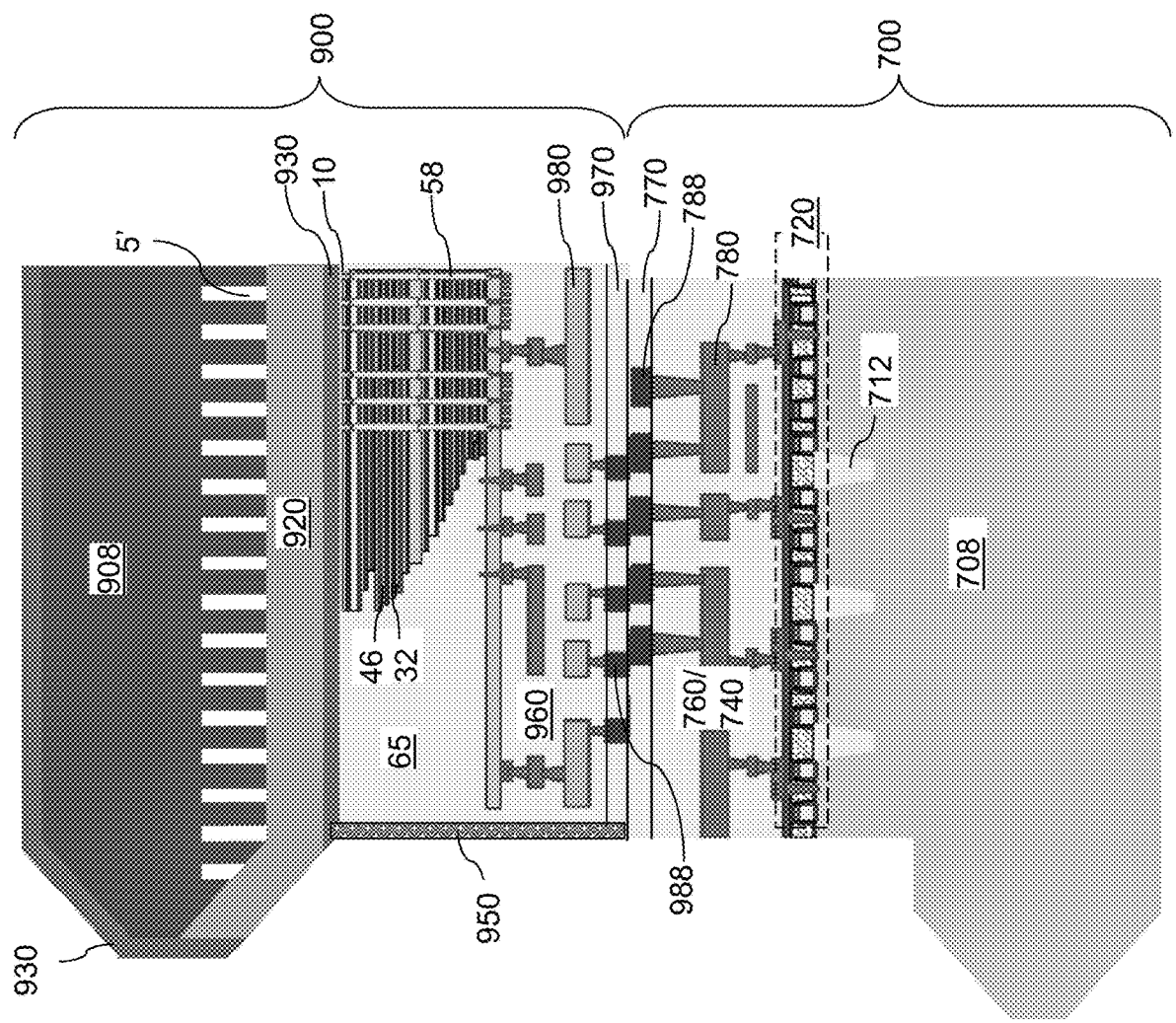
FIG. 8B is a schematic vertical cross-sectional view of a peripheral region of the bonded assembly of FIG. 8A.

Referring to FIGS. 8A and 8B, the first semiconductor structure 900 and the second semiconductor structure 700 are oriented such that the first bonding dielectric layer 970 faces the second bonding dielectric layer 770. The second semiconductor structure 700 and the first semiconductor structure 900 are brought into contact such that a surface of the second dielectric material layers (740, 760, 770) (such as a surface of the second bonding dielectric layer 770) contacts a surface of the first dielectric material layers (290, 960, 970) (such as a surface of the first bonding dielectric layer 970). The first semiconductor structure 900 and the second semiconductor structure 700 may be laterally aligned such that each second bonding pad 788 faces a respective one of the first bonding pads 988. In one embodiment, the pattern of the second bonding pads 788 may be a mirror image of the pattern of the first bonding pads 988 with optional differences in the size of bonding pads between the first semiconductor structure 900 and the second semiconductor structure 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, a real overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

The second bonding pads 788 may be bonded to the first bonding pads 988 by performing an anneal process that induces metal-to-metal bonding between the second bonding pads 788 and the first bonding pads 988 and optionally dielectric bonding between the respective bonding dielectric layers (970, 770). The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. In one embodiment, oxide-to-oxide bonding may optionally simultaneously occur between the first bonding dielectric layer 970 and the second bonding dielectric layer 770 during bonding of the second bonding pads 788 to the first bonding pads 988. In this hybrid bonding embodiment, the second bonding dielectric layer 970 may be bonded to the first bonding dielectric layer 770 during bonding of the second bonding pads 988 to the first bonding pads 788 via oxide-to-oxide bonding.

Figure 9:
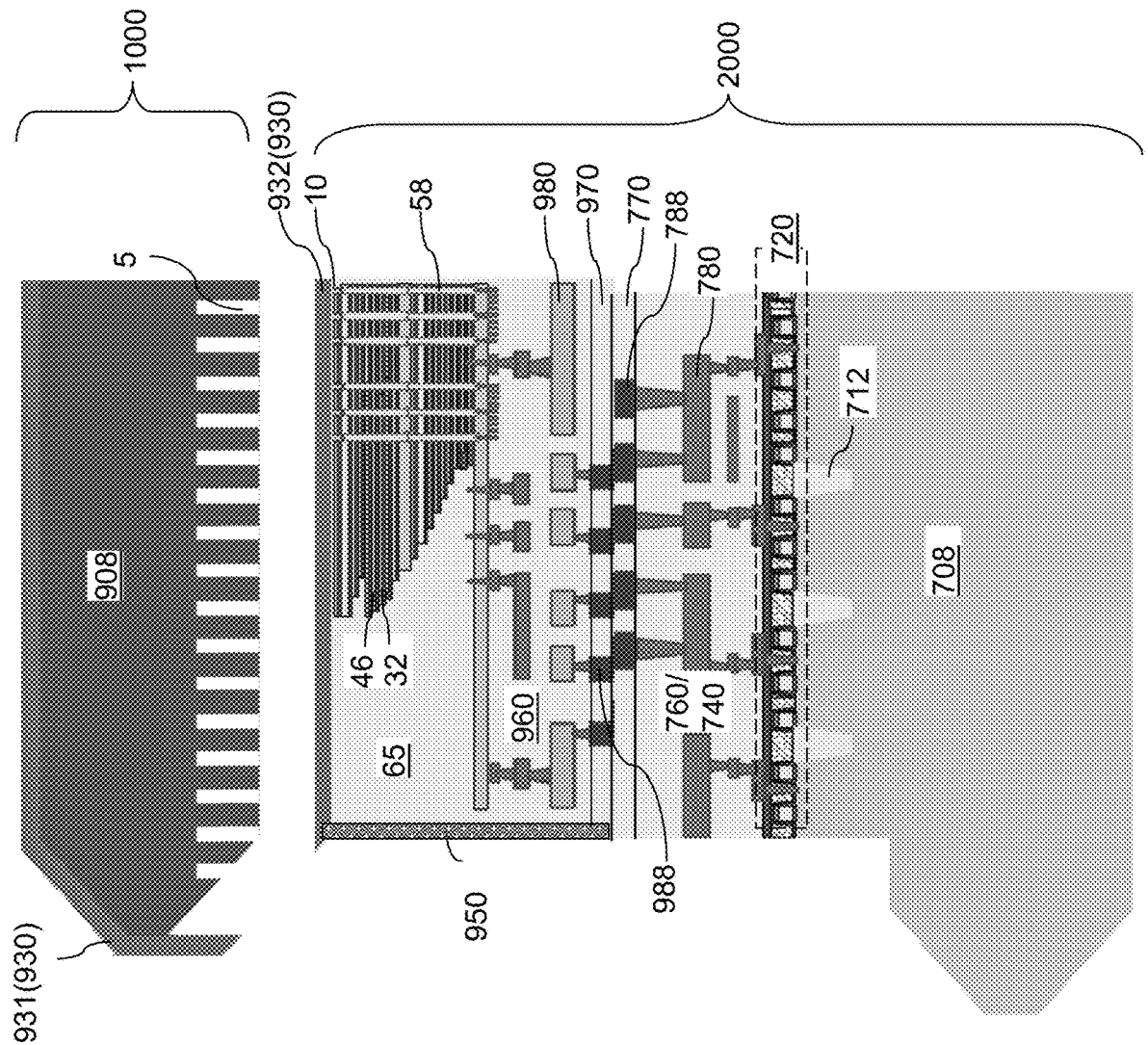
FIG. 9 is a schematic vertical cross-sectional view of a peripheral region of the bonded assembly after removal of the cover layer according to an embodiment of the present disclosure.

Referring to FIG. 9, the cover layer 920 can be removed by performing an isotropic etch process. In one embodiment, the isotropic etch process comprises a wet etch process that employs a wet etchant that etches a material of the cover layer 920 selective to materials of the support substrate 908 and the encapsulation layer 930. The chemistry of the isotropic etch process can be selective to the materials of the support substrate 908 and the encapsulation layer 930. In other words, the isotropic etch process can etch the material of the cover layer 920 at an etch rate that is at least 10 times the etch rate of the material of the support substrate 9098, and is at least 10 times the etch rate of the material of the encapsulation layer 930. The isotropic etch process can first etch the peripheral portions of the cover layer 920, and then etch center portions of the cover layer 920 that underlie (or overlie depending on the orientation of the bonded structure) the first semiconductor devices 940 by propagating an isotropic etchant through the cavities 5' in the channels 5.

For example, if the support substrate 908 consists essentially of a semiconductor material such as silicon, then the cover layer 920 can include borosilicate glass, borophosphosilicate glass or organosilicate glass, and a wet etch process employing a hydrofluoric acid-based solution can etch the cover layer 920 selective to the support substrate 908 and the encapsulation layer 930.

The ratio of the etch rate for the material of the cover layer 920 to the etch rate for the material of the support substrate 908 is herein referred to as a first selectivity. The ratio of the etch rate for the material of the cover layer 920 to the etch rate for the material of the encapsulation layer 930 is herein referred to as a second selectivity. The first selectivity and the second selectivity are greater than 10. In one embodiment, the first selectivity may be greater than 100, and/or may be greater than 1,000. In one embodiment, the second selectivity may be greater than 100, and/or may be greater than 1,000.

The cavities 5' laterally extend along horizontal directions within a surface portion of the support substrate 908. The cavities 5' function as conduits for the isotropic etchant of the isotropic etch process. The duration of the isotropic etch process is selected such that the entire material of the cover layer 620 is removed by the isotropic etch process. The first selectivity can be sufficiently high such that the channels 5 do not merge among one another during the isotropic etch process. In one embodiment, any increase in the width of each channel 5 may be less than 10% of the initial width of the respective channel 5. In one embodiment, the second selectivity can be sufficiently high such that the horizontal portion of the encapsulation layer 930 that is attached to the first semiconductor devices 940 is not completely removed during the isotropic etch process. The passivation dielectric spacer 950 can protect the first dielectric material layers (290, 960, 970) during removal of the cover layer 920.

The exemplary structure includes a first assembly 1000 of the support substrate 908 and a first portion 931 of the encapsulation layer 930 located on the backside surface of the support substrate 908. The exemplary structure also includes a second assembly 2000 of a second portion 932 of the encapsulation layer 930, the first semiconductor devices 940, the first metal interconnect structures 980, the first dielectric material layers (290, 960, 970), the first bonding pads 988, the second bonding pads 788, the second metal interconnect structures 780, the second dielectric material layers (740, 760, 770), the second semiconductor devices 720, and at least a portion of the device substrate 708, which may be the entirety of the device substrate 708. The first assembly 1000 is separated from the second assembly 2000 upon removal of the cover layer 920.

Figure 10:
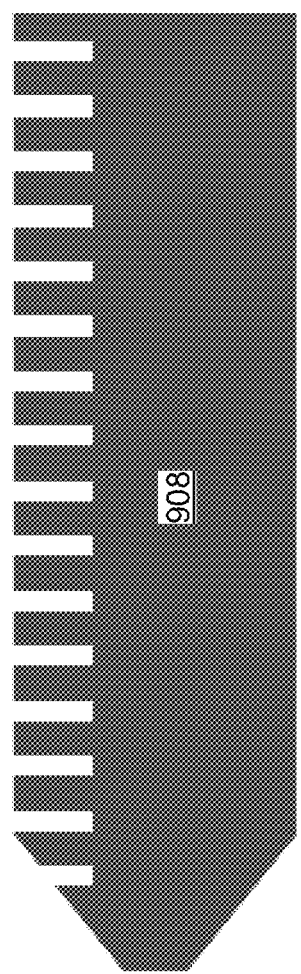
FIG. 10 is a schematic vertical cross-sectional view of a peripheral region of the support substrate after removal of a backside portion of the encapsulation layer according to an embodiment of the present disclosure.

Referring to FIG. 10, the first portion 931 (i.e., the backside portion) of the encapsulation layer 930 can be removed from the first assembly selective to the material of the support substrate 908 by an isotropic etch process, which may include a wet etch process. The support substrate 908 with the plurality of channels 5 can be subsequently employed to form another instance of the first semiconductor structure 900 illustrated in FIG. 6 by performing the processing steps of FIGS. 3-6. In this case, a second cover layer (which can have the same material composition as the cover layer 920) can be formed by anisotropically depositing the sacrificial cover material over the plurality of channels 5 after removing the first portion 931 of the encapsulation layer 930 from the support substrate 908. A second encapsulation layer (which can have the same material composition as the encapsulation layer 930) can be conformally deposited on a top surface of the second cover layer and on a backside surface of the support substrate 908. Subsequently, third semiconductor devices, third metal interconnect structures embedded in third dielectric material layers, and third bonding pads can be formed over a top surface of the second encapsulation layer. In one embodiment, the third semiconductor devices may be identical to the first semiconductor devices 940 in structure and material composition, the third metal interconnect structures may be identical to the first metal interconnect structures 980 in structure and material composition, the third dielectric material layers may be identical to the first dielectric material layers (290, 960, 970) in structure and composition, and the third bonding pads may be identical to the first bonding pads 988 in structure and composition.

Figure 11:
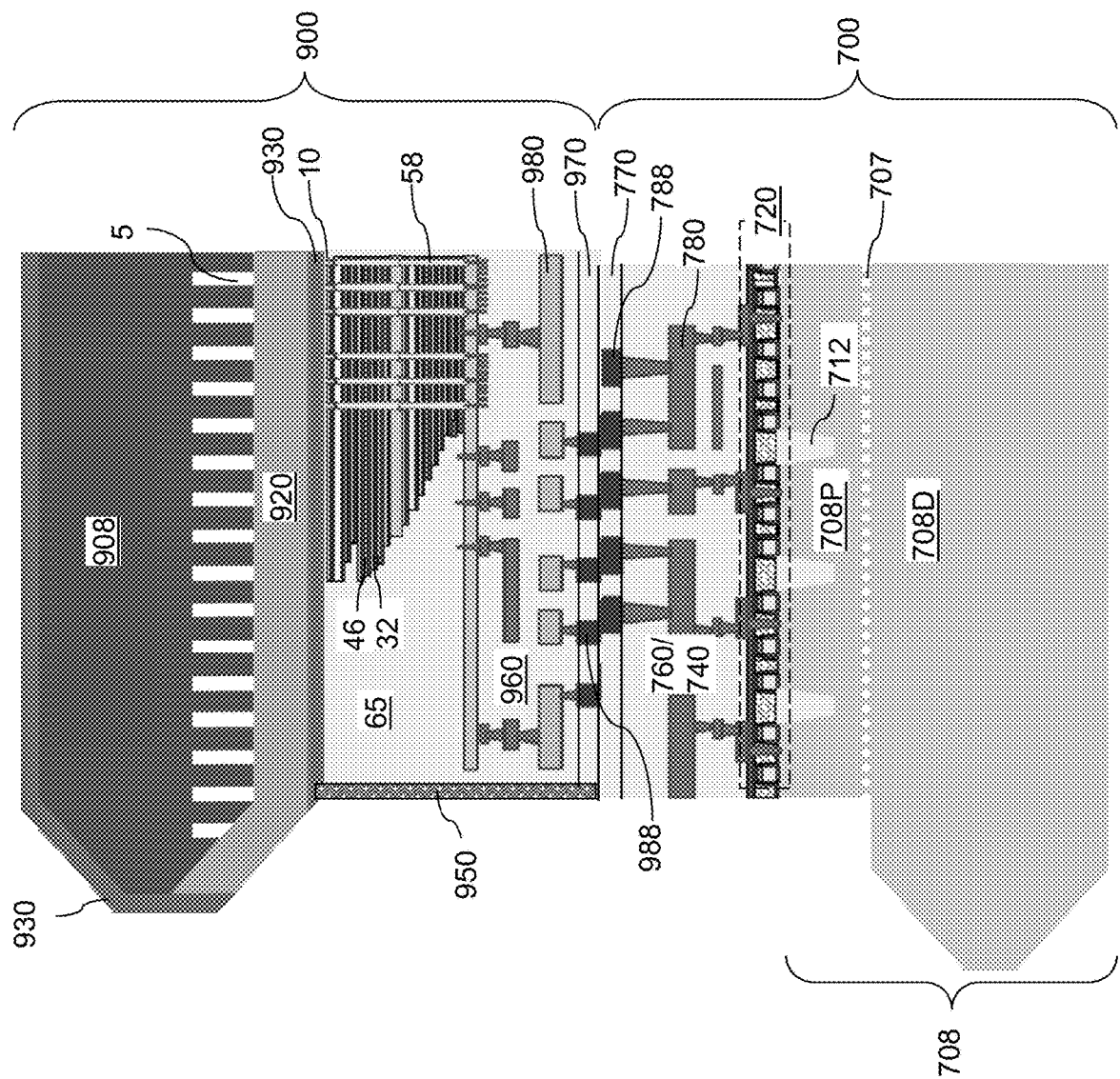
FIG. 11 is a schematic vertical cross-sectional view of a peripheral region of a bonded assembly including the support substrate and structures thereupon and the device substrate and structures thereupon in case the device substrate includes a hydrogen-implanted layer according to an embodiment of the present disclosure.

Referring to FIG. 11, an alternative embodiment of the exemplary structure of FIGS. 8A and 8B is illustrated, which includes a bonded assembly of a first semiconductor structure 900 and a second semiconductor structure 700. The first semiconductor structure 900 includes a support substrate 908 and structures thereupon, and the second semiconductor structure 700 includes a device substrate 708 and structures thereupon. The alternative embodiment illustrated in FIG. 11 can be derived from the exemplary structure of FIGS. 8A and 8B by employing a semiconductor substrate embedding a buried hydrogen-implanted layer 707 therein as the device substrate 708. In one embodiment, the device substrate 708 can comprise a silicon substrate including a hydrogen-implanted layer 707 located between a proximal semiconductor layer 708P and a distal semiconductor layer 708D. In other words, the buried hydrogen-implanted layer 707 separates the overlying proximal semiconductor layer 708P from the underlying distal semiconductor layer 708D. The proximal semiconductor layer 708P is more proximal to the second semiconductor devices 720 than the distal semiconductor layer 708D is to the second semiconductor devices 720.

The hydrogen-implanted layer 707 can be formed within the device substrate 708 prior to formation of any of the second semiconductor devices 720 by implanting hydrogen atoms into the device substrate 708 through the front-side surface of the device substrate 708. The front-side surface of the device substrate 708 refers to the surface of the device substrate 708 on which the second semiconductor devices 720 are subsequently formed. The hydrogen-implanted layer 707 can contain implanted hydrogen atoms at a density that is insufficient to induce cleavage of the device substrate 708, but is sufficient to form hydrogen bubbles at an elevated temperature of a subsequent anneal process at which the device substrate 708 is cleaved at the plane of the hydrogen-implanted layer 707. The depth of the hydrogen-implanted layer 707 (i.e., the thickness of the proximal semiconductor layer 708P) can be in a range from 50 nm to 500 nm, although lesser and greater depths can also be employed. In one embodiment, the hydrogen-implanted layer 707 may be formed by performing a hydrogen implantation step employed in a commercial Smart Cut™ process, which is described in U.S. Pat. No. 5,374,564. In one embodiment, an etch process may be employed after the processing steps of FIG. 7 and prior to processing steps of FIGS. 8A and 8B to remove peripheral portions of the proximal semiconductor layer 708P such that an annular top surface of the peripheral portion of the distal semiconductor layer 708D is physically exposed prior to bonding the first semiconductor structure 900 to the second semiconductor structure 700.

Figure 12:
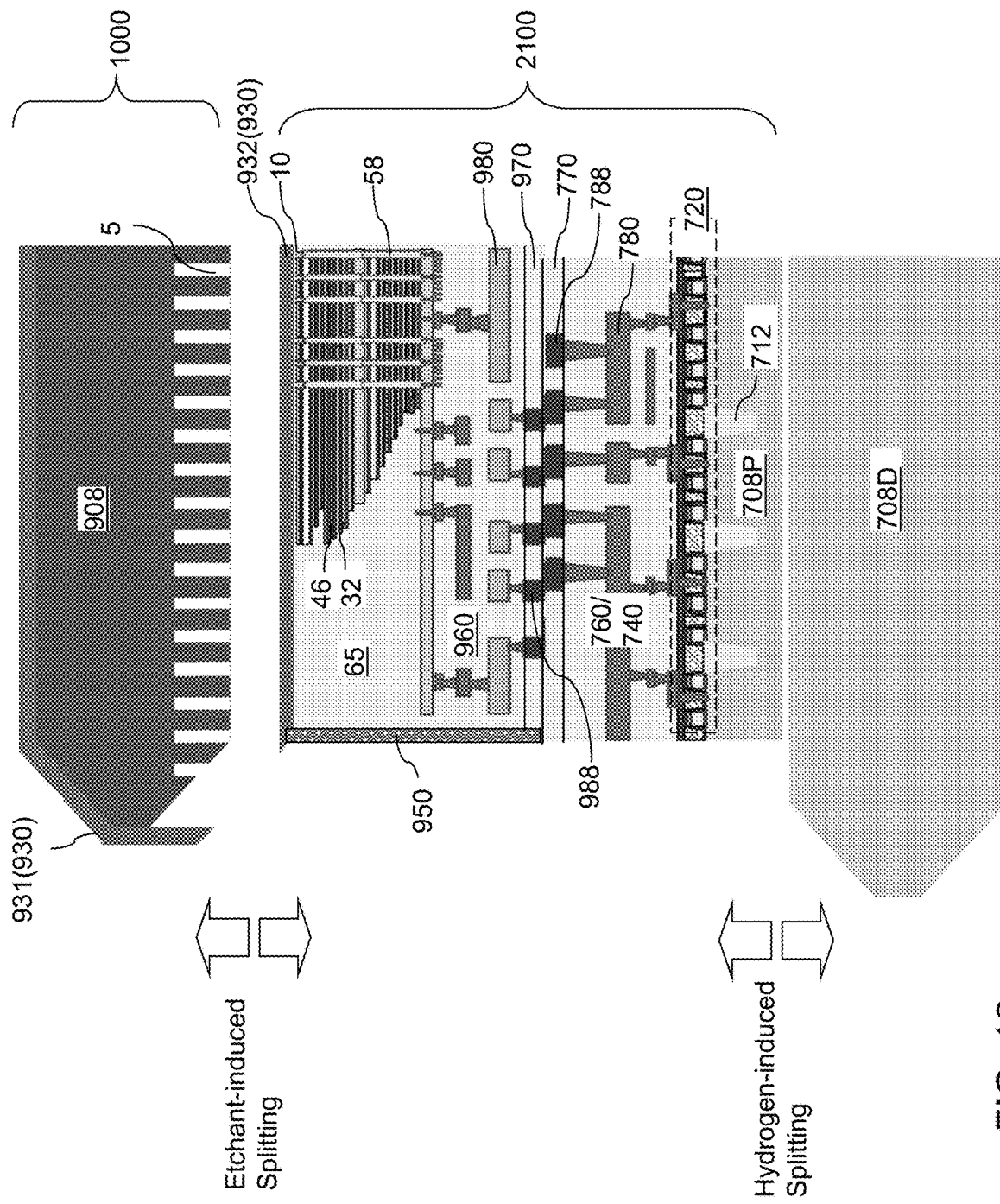
FIG. 12 is a schematic vertical cross-sectional view of a peripheral region of the bonded assembly after removal of the cover layer and after dissociating a distal semiconductor layer of the device substrate according to an embodiment of the present disclosure.

Referring to FIG. 12, the processing steps of FIG. 9 can be performed to remove the cover layer 920. Further, the distal semiconductor layer 708D of the device substrate 908 can be dissociated from the proximal semiconductor layer 708P of the device substrate 908 prior to, or after, removal of the cover layer 920. In one embodiment, the distal semiconductor layer 708D can be split from the proximal semiconductor layer 708P by performing an anneal process at an elevated temperature that induces blistering of hydrogen atoms in the hydrogen-implanted layer 707. The device substrate 908 is cleaved along the hydrogen-implanted layer 707, thereby separating the proximal semiconductor layer 708P from the distal semiconductor layer 708D. The elevated temperature of the anneal process may be in a range from 400 degrees Celsius to 600 degrees Celsius. In one embodiment, the splitting of the device substrate 908 may be formed by performing an exfoliation step employed in the commercial Smart Cut™ process, which is described in U.S. Pat. No. 5,374,564. In one embodiment, the anneal process can be performed after bonding the second bonding pads 988 to the first bonding pads 788. In one embodiment, the anneal process may be performed after removing the cover layer 920. In one embodiment, the anneal process may be performed prior to removing the cover layer 920.

The exemplary structure includes a first assembly 1000 of the support substrate 908 and a first portion 931 of the encapsulation layer 930 located on the backside surface of the support substrate 908. The exemplary structure also includes a second assembly 2100 of a second portion 932 of the encapsulation layer 930, the first semiconductor devices 940, the first metal interconnect structures 980, the first dielectric material layers (290, 960, 970), the first bonding pads 988, the second bonding pads 788, the second metal interconnect structures 780, the second dielectric material layers (740, 760, 770), the second semiconductor devices 720, and at least a portion of the device substrate 708. In case the distal semiconductor layer 708D is cleaved prior to removal of the cover layer 920, the portion of the device substrate 708 included in the second assembly 2100 comprises only the proximal semiconductor layer 708P. In case the distal semiconductor layer 708D is cleaved after removal of the cover layer 920, the portion of the device substrate 708 included in the second assembly comprises the entirety of the device substrate 708 prior to splitting off of the distal semiconductor layer 708D, and includes only the proximal semiconductor layer 708P after splitting off the distal semiconductor layer 708D. The first assembly 1000 is separated from the second assembly 2100 upon removal of the cover layer 920.

Figure 13:
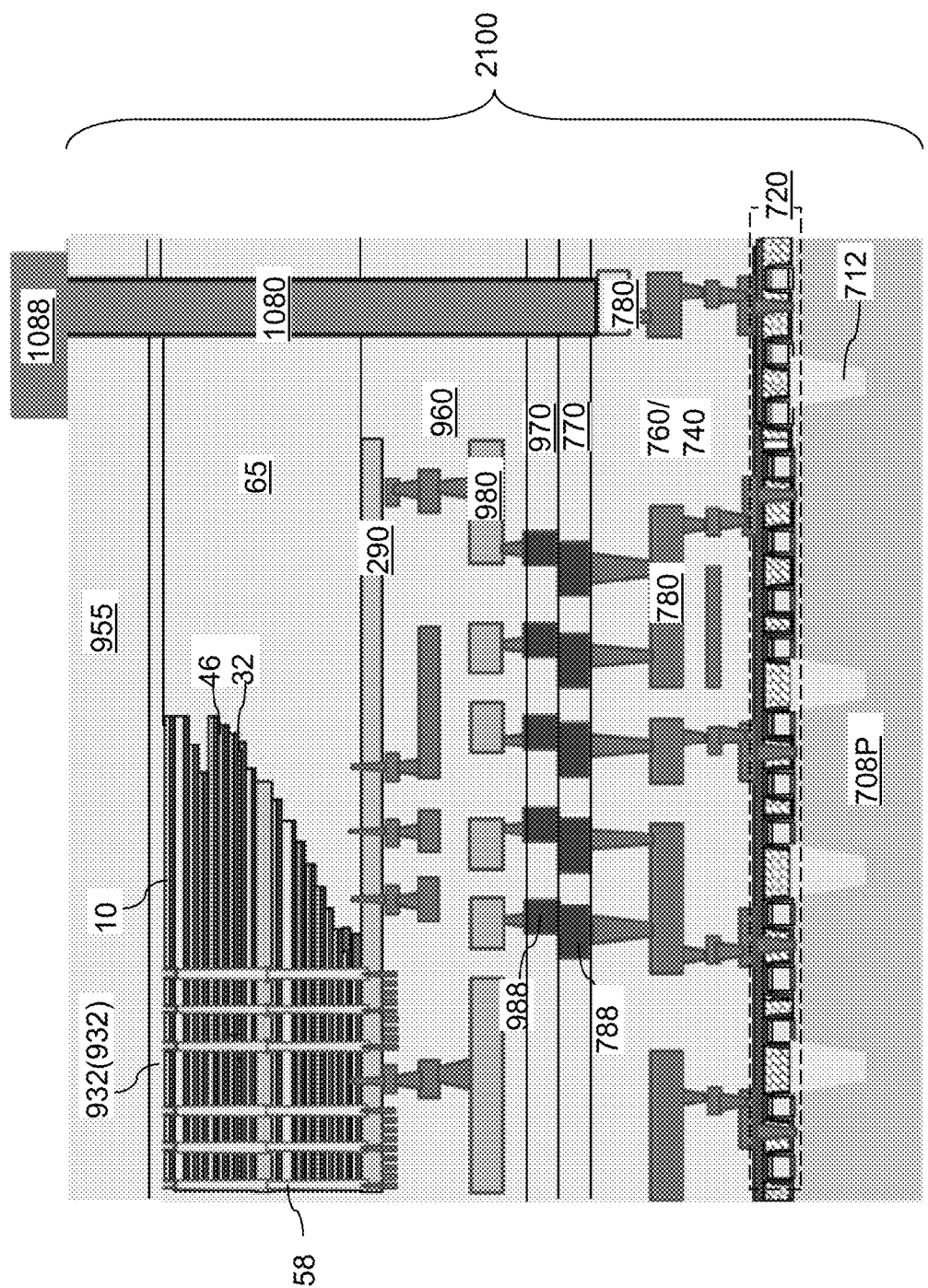
FIG. 13 is a schematic vertical cross-sectional view of a bonded assembly including the first semiconductor devices and the second semiconductor devices after formation of pad contact via structures and external bonding pads according to an embodiment of the present disclosure.

Referring to FIG. 13, a cap dielectric layer 955 may be optionally deposited on the second portion 932 of the encapsulation layer 930. Via cavities can be formed through the optional cap dielectric layer 955, the second portion 932 of the encapsulation layer 930, the dielectric material portion 65, and the first dielectric material layers (290, 960, 870) and/or the second dielectric material layers (740, 760, 770) onto a respective one of the first metal interconnect structures 980 or a respective one of the second metal interconnect structures 780. Contact via structures 1080 can be formed in the via cavities, and external bonding pads 1088 can be formed on the contact via structures 1080. The second assembly 2100 may be diced and packaged as needed to provide a plurality of semiconductor chips, each including a pair of bonded semiconductor dies.

The processing steps of FIG. 10 can be performed on the first assembly 1000 of the support substrate 908 and the first portion 931 of the encapsulation layer 930 to remove the first portion 931 of the encapsulation layer 930. The support substrate 980 can be subsequently employed for another iteration of the sequence of processing steps of FIGS. 3-10 or a variant of the sequence of processing steps that employs the structures of FIGS. 11 and 12.

The various embodiments of the present disclosure provide a recyclable (i.e., reusable) support substrate 908 that can be employed multiple times between the processing steps of forming first semiconductor devices 940 and dissociating the first assembly 1000 from the second assembly (2000, 2100). The processing cost per semiconductor chip can be lowered through reuse of the support substrate 908 during manufacture of multiple bonded assemblies of two semiconductor structures (900, 700). Furthermore, the distal semiconductor layer 708D of the device substrate 708 may also be reused to further reduce cost.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of forming a semiconductor structure, comprising:
   providing a support substrate comprising a plurality of channels located on a front side;
   forming a cover layer by anisotropically depositing a sacrificial cover material over the plurality of channels, wherein cavities laterally extend within the plurality of channels underneath a horizontally extending portion of the cover layer;
   conformally depositing an encapsulation layer on a top surface of the cover layer and on a backside surface of the support substrate;
   forming first semiconductor devices, first metal interconnect structures embedded in first dielectric material layers, and first bonding pads over a top surface of the encapsulation layer;
   providing a device substrate with second semiconductor devices, second metal interconnect structures embedded in second dielectric material layers, and second bonding pads thereupon;
   bonding the second bonding pads with the first bonding pads to form a bonded assembly;
   removing peripheral portions of the encapsulation layer, wherein peripheral portions of the cover layer are physically exposed; and
   removing the cover layer employing an isotropic etch process by propagating an isotropic etchant through the cavities to separate the support substrate from the bonded assembly.

2. The method of claim 1, wherein a first assembly of the support substrate and a first portion of the encapsulation layer located on the backside surface of the support substrate is separated from a second assembly of a second portion of the encapsulation layer, the first semiconductor devices, the first metal interconnect structures, the first dielectric material layers, the first bonding pads, the second bonding pads, the second metal interconnect structures, the second dielectric material layers, the second semiconductor devices, and at least a portion of the device substrate.

3. The method of claim 2, further comprising removing the first portion of the encapsulation layer from the support substrate after the first assembly is separated from the second assembly.

4. The method of claim 3, further comprising:
   forming a second cover layer by anisotropically depositing a sacrificial cover material over the plurality of channels after removing the first portion of the encapsulation layer from the support substrate;
   conformally depositing a second encapsulation layer on a top surface of the second cover layer and on a backside surface of the support substrate; and
   forming third semiconductor devices, third metal interconnect structures embedded in third dielectric material layers, and third bonding pads over a top surface of the second encapsulation layer.

5. The method of claim 1, wherein:
   the device substrate comprises a silicon substrate including a hydrogen-implanted layer located between a proximal semiconductor layer and a distal semiconductor layer, wherein the proximal semiconductor layer is more proximal to the second semiconductor devices than the distal semiconductor layer is to the second semiconductor devices; and
   the method further comprises splitting the distal semiconductor layer from the proximal semiconductor layer by performing an anneal process at an elevated temperature that induces blistering of hydrogen atoms in the hydrogen-implanted layer.

6. The method of claim 5, wherein the anneal process is performed after bonding the second bonding pads to the first bonding pads.

7. The method of claim 6, wherein the anneal process is performed after removing the cover layer.

8. The method of claim 1, further comprising:
removing portions of the first dielectric material layers from a bevel region located in a peripheral region of the support substrate, wherein the peripheral portions of the encapsulation layer are physically exposed;
forming a passivation dielectric spacer on a physically exposed sidewall of the first dielectric material layers by conformally depositing and anisotropically etching a passivation dielectric material, wherein the passivation dielectric spacer protects the first dielectric material layers during removal of the cover layer.

9. The method of claim 8, wherein:
the passivation dielectric spacer has a tubular configuration and vertically extends from a top surface of an upper portion of the encapsulation layer that overlies the support substrate to a topmost layer within the first dielectric material layers; and
the passivation dielectric spacer comprises silicon nitride.

10. The method of claim 1, wherein the isotropic etch process comprises a wet etch process that employs a wet etchant that etches a material of the cover layer selective to materials of the support substrate and the encapsulation layer.

11. The method of claim 10, wherein the cover layer comprises a doped silicate glass or organosilicate glass.

12. The method of claim 11, wherein the encapsulation layer comprises a dielectric metal oxide material.

13. The method of claim 1, wherein each channel within the plurality of channels has a depth-to-width ratio in a range from 1 to 100.

14. The method of claim 1, wherein each channel width the plurality of channels has a depth in a range from 1 micron to 30 microns, and a width in a range from 100 nm to 5 microns.

15. The method of claim 1, wherein:
the first semiconductor devices comprise a three-dimensional array of memory elements; and
the second semiconductor devices comprise a logic circuit configured to control operation of the three-dimensional array of memory elements.

16. The method of claim 15, wherein the first semiconductor devices comprise:
an alternating stack of insulating layers and electrically conductive layers; and
a two-dimensional array of vertical NAND strings that vertically extend through the alternating stack, wherein each of the vertical NAND strings comprises a respective vertical semiconductor channel and memory film.

17. The method of claim 1, wherein the plurality of channels comprises:
first channels that laterally extend straight along a first horizontal direction from a respective first end point at a peripheral region of the support substrate to a respective second end point at a peripheral region of the support substrate; and
second channels that laterally extend straight along a second horizontal direction from a respective first end point at the peripheral region of the support substrate to a respective second end point at a peripheral region of the support substrate and intersecting a respective subset of the first channels.

18. The method of claim 1, wherein the plurality of channels comprises a plurality of serpentine channels that extend along a first horizontal direction from a respective first end point at a peripheral region of the support substrate to a respective second end point at the peripheral region of the support substrate with a lateral undulation along a second horizontal direction that is perpendicular to the first horizontal direction.

19. The method of claim 1, wherein the plurality of channels comprises:
radial channels that extend straight radially from a respective first end point at a peripheral region of the support substrate to a respective second end point that is more proximal to a vertical axis passing through a geometrical center of the support substrate than to the peripheral region of the support substrate; and
azimuthal channels that are located at a respective distance from the vertical axis passing through the geometrical center of the support substrate and intersecting a respective subset of the support substrate.

\* \* \* \* \*